US012615801B2

(12) United States Patent
More et al.

(10) Patent No.: US 12,615,801 B2
(45) Date of Patent: Apr. 28, 2026

(54) MULTI-GATE TRANSISTORS HAVING DEEP INNER SPACERS

(71) Applicant: Taiwan Semiconductor Manufacturing Company, Ltd., Hsinchu (TW)

(72) Inventors: Shahaji B. More, Hsinchu City (TW); Cheng-Han Lee, New Taipei City (TW); Shih-Chieh Chang, Taipei City (TW); Wan-Hsuan Hsieh, Hsinchu City (TW); Yi-Chun Liu, Taichung City (TW); Chee-Wee Liu, Taipei City (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 684 days.

(21) Appl. No.: 17/672,957

(22) Filed: Feb. 16, 2022

(65) Prior Publication Data

US 2023/0058459 A1    Feb. 23, 2023

Related U.S. Application Data

(60) Provisional application No. 63/234,432, filed on Aug. 18, 2021.

(51) Int. Cl.
H10D 30/67        (2025.01)
H10D 30/01        (2025.01)
(Continued)

(52) U.S. Cl.
CPC ....... H10D 30/6735 (2025.01); H10D 30/014 (2025.01); H10D 30/43 (2025.01);
(Continued)

(58) Field of Classification Search
CPC ........... H01L 29/42392; H01L 29/0673; H01L 29/1079; H01L 29/66439; H01L 29/66545;
(Continued)

(56) References Cited

U.S. PATENT DOCUMENTS 9,754,840 B2    9/2017  Lin et al.
9,818,872 B2    11/2017  Ching et al.
(Continued)

FOREIGN PATENT DOCUMENTS

TW        202147462 A    12/2021
TW        I777634 B      9/2022

OTHER PUBLICATIONS

Feng-Ching Chu et al., Epitaxial Features, U.S. Appl. No. 17/321,996, filed May 17, 2021, Assignee: Taiwan Semiconductor Manufacturing Co., Ltd., 31 pages specification, 27 pages drawings.

*Primary Examiner* — Suberr L Chi
(74) *Attorney, Agent, or Firm* — HAYNES AND BOONE, LLP

(57)        ABSTRACT
The present disclosure provides a semiconductor structure and a method of forming the same. A semiconductor structure according to the present disclosure includes a plurality of nanostructures disposed over a substrate, a plurality of inner spacer features interleaving the plurality of nanostructures. The plurality of nanostructures are arranged along a direction perpendicular to the substrate. The plurality of inner spacer features include a bottommost inner spacer feature and upper inner spacer features disposed above the bottommost inner spacer feature. The first height of the bottommost inner spacer feature along the direction is greater than a second height of each of the upper inner spacer features.

20 Claims, 20 Drawing Sheets

(51) Int. Cl.

| | |
|---|---|
| *H10D 30/43* | (2025.01) |
| *H10D 30/69* | (2025.01) |
| *H10D 62/10* | (2025.01) |
| *H10D 62/17* | (2025.01) |
| *H10D 64/01* | (2025.01) |
| *H10D 62/832* | (2025.01) |
| *H10D 64/27* | (2025.01) |

(52) U.S. Cl.

CPC ..... *H10D 30/6713* (2025.01); *H10D 30/6757* (2025.01); *H10D 30/797* (2025.01); *H10D 62/121* (2025.01); *H10D 62/364* (2025.01); *H10D 64/017* (2025.01); *H10D 62/832* (2025.01); *H10D 64/518* (2025.01)

(58) Field of Classification Search

CPC .............. H01L 29/775; H01L 29/7848; H01L 29/78618; H01L 29/78696; H01L 29/161; H01L 29/42376; H01L 29/0847; H01L 29/41725; H01L 29/165; H01L 29/0665; H01L 29/0649; H01L 29/0684; H01L 29/66795; H01L 29/785; H01L 29/41791; H01L 29/7831; H01L 2029/7858; H01L 21/823431; H01L 21/823821; H01L 21/845; H01L 29/66553; H01L 29/6656; H01L 21/823418; H01L 21/823814; B82Y 10/00; H10D 30/6735; H10D 30/014; H10D 30/43; H10D 30/6757; H10D 62/121; H10D 62/364; H10D 64/017; H10D 62/832; H10D 64/518; H10D 30/6713; H10D 30/797

See application file for complete search history.

(56) References Cited

U.S. PATENT DOCUMENTS

| | | | |
|---|---|---|---|
| 10,032,627 | B2 | 7/2018 | Lee et al. |
| 10,243,054 | B1 * | 3/2019 | Cheng ................... H01L 27/088 |
| 10,290,546 | B2 | 5/2019 | Chiang et al. |
| 10,475,902 | B2 | 11/2019 | Lee et al. |
| 10,950,731 | B1 | 3/2021 | Peng et al. |
| 10,971,585 | B2 * | 4/2021 | Lee ........................ H01L 21/762 |
| 11,031,292 | B2 | 6/2021 | Ju et al. |
| 2019/0067456 | A1 * | 2/2019 | Wong .................... H01L 21/324 |
| 2019/0067490 | A1 * | 2/2019 | Yang ................. H10D 30/6735 |
| 2019/0221483 | A1 | 7/2019 | Mulfinger |
| 2020/0105755 | A1 * | 4/2020 | Cea ...................... H10D 62/121 |
| 2020/0144367 | A1 * | 5/2020 | Tsou ..................... H01L 29/785 |
| 2020/0365687 | A1 * | 11/2020 | Xie ..................... H01L 27/0886 |
| 2021/0082686 | A1 * | 3/2021 | Chiang ............. H01L 21/02507 |
| 2021/0202478 | A1 * | 7/2021 | Guha ................ H01L 29/78696 |
| 2021/0249531 | A1 * | 8/2021 | Liaw ................. H01L 29/66818 |
| 2022/0069135 | A1 * | 3/2022 | Chu ..................... H10D 64/518 |

* cited by examiner

MULTI-GATE TRANSISTORS HAVING DEEP INNER SPACERS

PRIORITY DATA

This application claims priority to U.S. Provisional Patent Application No. 63/234,432, filed on Aug. 18, 2021, entitled "Multi-gate Transistors Having Deep Source/Drain Features", the entire disclosure of which is hereby incorporated herein by reference.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs.

For example, as integrated circuit (IC) technologies progress towards smaller technology nodes, multi-gate metal-oxide-semiconductor field effect transistor (multi-gate MOSFET, or multi-gate devices) have been introduced to improve gate control by increasing gate-channel coupling, reducing off-state current, and reducing short-channel effects (SCEs). A multi-gate device generally refers to a device having a gate structure, or portion thereof, disposed over more than one side of a channel region. Multi-bridge-channel (MBC) transistors are examples of multi-gate devices that have become popular and promising candidates for high performance and low leakage applications. An MBC transistor has a gate structure that can extend, partially or fully, around a channel region to provide access to the channel region on two or more sides. Because its gate structure surrounds the channel regions, an MBC transistor may also be referred to as a surrounding gate transistor (SGT) or a gate-all-around (GAA) transistor.

Formation of an MBC transistor includes forming on a substrate a stack that includes channel layers interleaved by sacrificial layers. When a gate replacement process or a gate-last process is adopted, a dummy gate stack is first formed over a channel region as a placeholder before source/drain regions are recessed to form source/drain trenches where sidewalls of the channel layers and sacrificial layers are exposed. The exposed sacrificial layers are selectively and partially etched to form inner spacer recesses. Inner spacer features are then formed in the inner spacer recesses. After the formation of inner spacer features, source/drain feature are formed in the source/drain trenches. The inner spacer features protect the source/drain features when the sacrificial layers in the channel region are selectively removed to release channel layers as channel members. While MBC transistors and inner spacer features are generally adequate to their intended purposes, they are not satisfactory in all aspects.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

Figure 1:
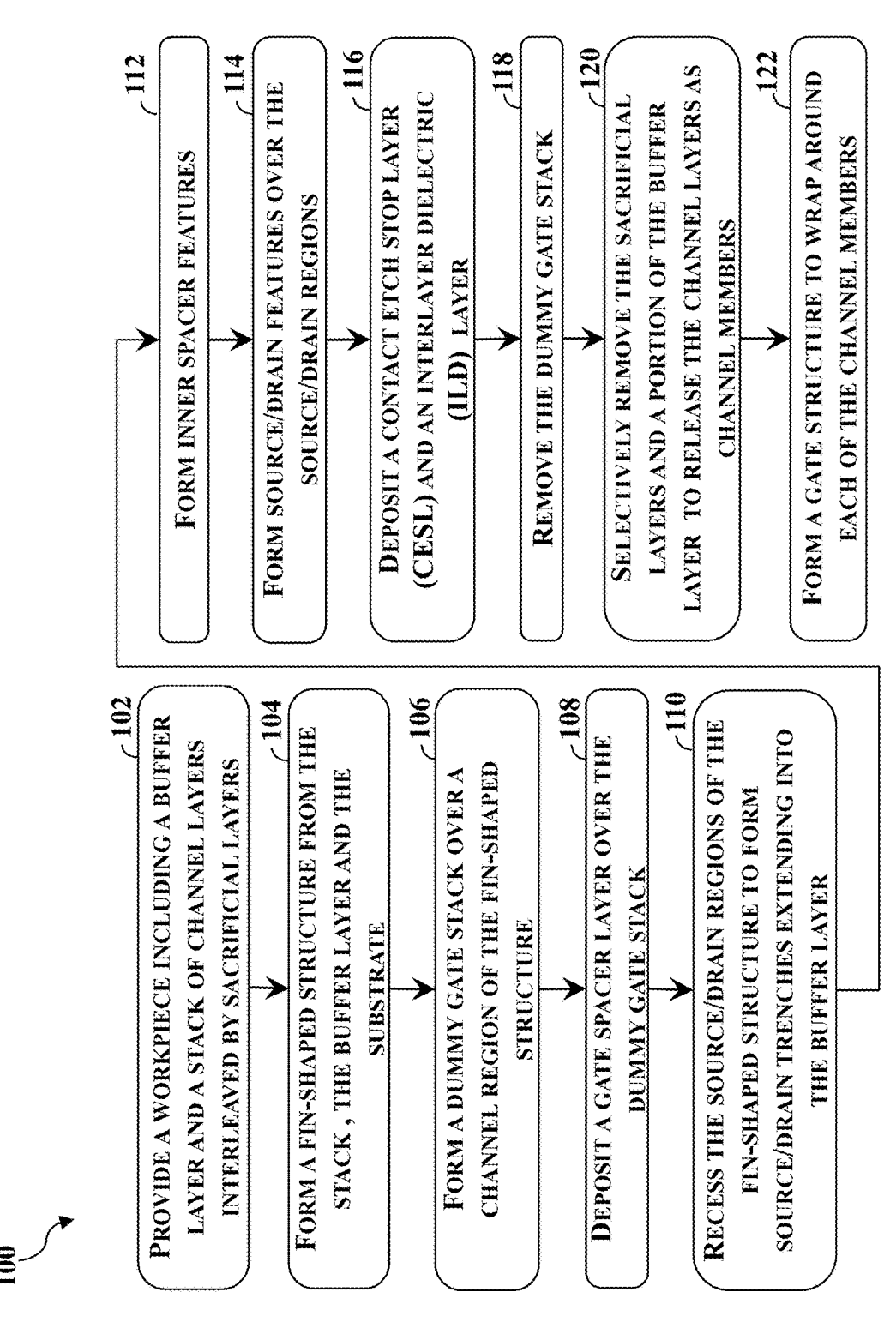
FIG. 1 illustrates a flowchart of a method for forming a semiconductor device, according to one or more aspects of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Further, when a number or a range of numbers is described with "about," "approximate," and the like, the term is intended to encompass numbers that are within a reasonable range considering variations that inherently arise during manufacturing as understood by one of ordinary skill in the art. For example, the number or range of numbers encompasses a reasonable range including the number described, such as within +/−10% of the number described, based on known manufacturing tolerances associated with manufacturing a feature having a characteristic associated with the number. For example, a material layer having a thickness of "about 5 nm" can encompass a dimension range from 4.25 nm to 5.75 nm where manufacturing tolerances associated with depositing the material layer are known to be +/−15% by one of ordinary skill in the art. Still further, the present disclosure may repeat reference numerals and/or letters in the various examples. This repetition is for the purpose of simplicity and clarity and does not in itself dictate a relationship between the various embodiments and/or configurations discussed.

The present disclosure is generally related to multi-gate transistors and fabrication methods, and more particularly to MBC transistors having deep inner spacer features. In some instances, a channel region of an MBC transistor may include a vertical stack of germanium-tin (GeSn) nanostructures or a vertical stack of silicon germanium (SiGe) nanostructures that extend between two source/drain features. To form the vertical stack of nanostructures, a stack that includes channel layers interleaved by sacrificial layers may be formed over a substrate. The channel layers will be patterned into the vertical stack of nanostructures after the sacrificial layers are selectively removed. The sacrificial layers may include germanium. To reduce lattice defects in the stack, a buffer layer may be disposed between the substrate and the stack. In some instances, the buffer layer may include undoped germanium (Ge). The substrate, the buffer layer, and the stack may be patterned to form fin-shaped structures that includes channel regions and source/drain regions. After dummy gate stack is formed over the channel regions, the source/drain regions are recessed to form source/drain trenches. After the dummy gate stack is removed, the sacrificial layers in the channel region are selectively removed to release the channel layers are channel members. A gate structure is then formed to wrap around each of the channel members. In some instances, both the source/drain features and the gate structure may extend into the buffer layer and come into direct contact, leading to an electrical short.

The present disclosure provides MBC transistor structures and methods of forming the same. An MBC transistor of the present disclosure includes source/drain features that are disposed over a buffer layer that is formed of germanium (Ge). A vertical stack of channel members is disposed over the substrate and extend between the source/drain features. A gate structure is disposed between the source/drain features and wraps around each of the vertical stack of channel members. The gate structure may partially or completely extend through the buffer layer. In the latter case, the gate structure may come in contact with the substrate. The gate structure is spaced apart from the source/drain features by a plurality of inner spacer features. The bottommost inner spacer features are different from the rest of the inner spacer features. The bottommost inner spacer features extend vertically across a portion of the buffer layer and the bottommost sacrificial layer while the other inner spacer features vertically correspond to the thickness of the sacrificial layers only. Accordingly, a height of the bottommost inner spacer features is therefore greater than a height of the other inner spacer features. The bottommost inner spacer features may also be referred to as deep inner spacer features. Deep inner spacer features function to keep the gate structure and the source/drain features physically separate from one another when the gate structure and the source/drain features extend into the buffer layer.

The various aspects of the present disclosure will now be described in more detail with reference to the figures. In that regard, FIG. 1 is a flowchart illustrating a method 100 of forming a semiconductor device from a workpiece according to embodiments of the present disclosure. Method 100 is merely an example and is not intended to limit the present disclosure to what is explicitly illustrated in method 100. Additional steps can be provided before, during and after the method 100, and some steps described can be replaced, eliminated, or moved around for additional embodiments of the method. Not all steps are described herein in detail for reasons of simplicity. Method 100 is described below in conjunction with FIG. 2-16, which are fragmentary cross-sectional views of workpiece 200 at different stages of fabrication according to embodiments of the method 100 in FIG. 1. Because the workpiece 200 will be fabricated into a semiconductor device, the workpiece 200 may be referred to herein as a semiconductor device 200 or a semiconductor structure 200 as the context requires. Throughout the present disclosure, like reference numerals denote like features, unless otherwise excepted.

Figure 2:
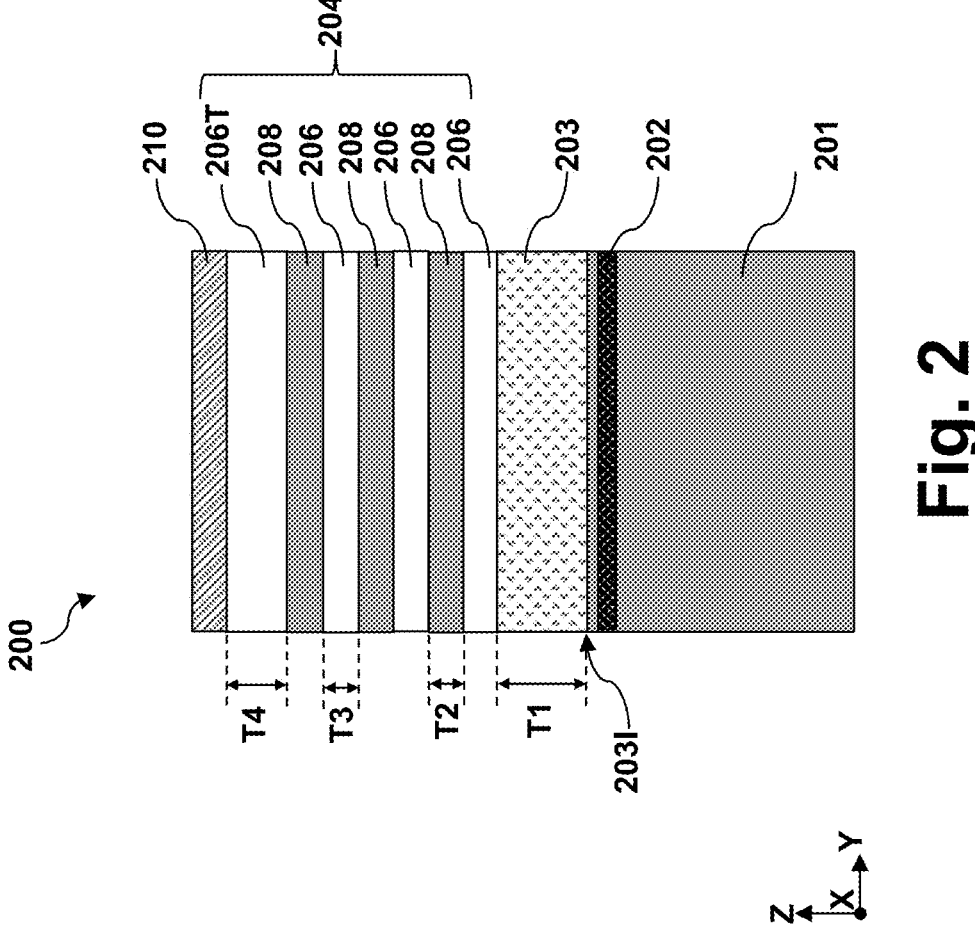
FIGS. 2-16 illustrate fragmentary cross-sectional views of a workpiece during a fabrication process according to the method of FIG. 1, according to one or more aspects of the present disclosure.

Referring to FIGS. 1 and 2, method 100 includes a block 102 where a workpiece 200 is provided. The workpiece 200 includes a stack 204 of alternating semiconductor layers disposed over a substrate 201. The substrate 201 may be a bulk semiconductor substrate. In one embodiment, the substrate 201 is a bulk silicon (Si) substrate. In some alternative embodiments, the substrate 201 may include germanium (Ge), a compound semiconductor such as silicon carbide (SiC), gallium arsenic (GaAs), indium arsenide (InAs), indium phosphide (InP), or an alloy semiconductor such as germanium-tin (GeSn), silicon germanium (SiGe), silicon germanium carbide (SiGeC), gallium arsenic phosphide (GaAsP), or gallium indium phosphide (GaInP). Alternatively, the substrate 201 may include a buried oxide layer to have a semiconductor-on-insulator construction. For example, the substrate 201 may include a silicon-on-insulator (SOI) structure, a germanium-on-insulator (GeOI) structure, or a germanium-tin-on-insulator (GeSnOI) structure. In the embodiment depicted in FIG. 2, the substrate 201 has an SOI structure and includes a buried oxide layer 202 in a bulk silicon (Si) substrate. While not explicitly shown in FIG. 2, the substrate 201 may be a bulk silicon (Si) substrate without the buried oxide layer 202. As shown in FIG. 2, a top surface of the substrate 201 may include silicon (Si).

In some embodiments represented in FIG. 2, the workpiece 200 includes a buffer layer 203 disposed directly on the substrate 201. The buffer layer 203 serves as a transition region between the substrate 201 and a bottommost layer of the stack 204 to reduce lattice mismatch. Because the layers in the stack 204 are formed using epitaxial deposition, lattice defects in lower epitaxial layers may permeate to upper epitaxial layers. For example, when a top surface of the substrate 201 consists essentially of silicon and the bottommost layer in the stack 204 consists essentially of germanium, the germanium lattice in the bottommost layer in the stack 204 may be subject to substantial strain due to lattice mismatch between silicon and germanium. Such strain may lead to lattice defects and these lattice defects may be translated into epitaxial layers overlying the bottommost layer in the stack 204. When the buffer layer 203 of a sufficient thickness is epitaxially deposited on the substrate 201 as shown in FIG. 2, lattice defects may only be present at or near an interface 203I with the substrate 201 but do not propagate through the thickness of the buffer layer 203. This is so because the lattice strain may be gradually released with the distance from the interface 203I. In an ideal case, a top surface of the buffer layer 203 may include germanium lattice structures that are substantially defect-free. The top surface of the buffer layer 203 therefore serves as a low-lattice-strain foundation for the formation of the stack 204.

In some embodiments, the buffer layer 203 includes germanium (Ge) that is undoped or not intentionally doped. To sufficiently release the lattice strain at the interface 203I, the buffer layer 203 may have a first thickness T1 between about 50 nm and about 200 nm. This thickness is not trivial. When the thickness of the buffer layer 203 is smaller than 50 nm, the lattice defect density on the top surface of the buffer layer 203 may still be too high, preventing formation of high-quality stack 204. When the thickness of the buffer layer 203 is greater than 200 nm, the buffer layer 203 may unduly increase the thickness of the workpiece 200, which may increase process time and production cost.

In some embodiments, the stack 204 includes channel layers 208 of a first semiconductor composition interleaved by sacrificial layers 206 of a second semiconductor composition. The first semiconductor composition is different from the second semiconductor composition such that the sacrificial layers 206 may be selectively recessed or removed in subsequent process steps. In some embodiments, the sacrificial layers 206 include germanium (Ge) and the channel layers 208 include silicon germanium (SiGe) or germanium-tin (GeSn). When the channel layers 208 include germanium-tin (GeSn), each of the channel layers 208 may include about 7% and about 13% of tin and about 87% and about 93% of germanium. To increase the etch selectivity of the sacrificial layers 206 relative to channel layers 208, the sacrificial layers 206 may be doped with a p-type dopant, such as boron (B), or an n-type dopant, such as phosphorus (P) or arsenic (As). In the depicted embodiments, the sacrificial layers 206 are doped with boron (B) and the sacrificial layers 206 may be said to be formed of boron-doped germanium (Ge:B). In some implementations, the sacrificial layers 206 may include a boron concentration between about $5 \times 10^{18}$ atoms/cm$^3$ and about $2 \times 10^{21}$ atoms/cm$^3$. With the presence of the dopant, a germanium content in the sacrificial layers 206 may be between about 90% and about 100%. It is noted that fourth (4) layers of the sacrificial layers 206 and three (3) layers of the channel layers 208 are alternately arranged as illustrated in FIG. 2, which is for illustrative purposes only and not intended to be limiting beyond what is specifically recited in the claims. It can be appreciated that any number of epitaxial layers may be formed in the stack 204. The number of layers depends on the desired number of channels members for the semiconductor device 200. In some embodiments, the number of channel layers 208 is between 2 and 10.

In some embodiments, the channel layers 208 may have a substantially uniform second thickness T2 between about 5 nm and about 30 nm and the sacrificial layers 206 may have a substantially uniform third thickness T3 between about 5 nm and about 20 nm. The second thickness T2 and the third thickness T3 may be identical or different. In the depicted embodiment, a top sacrificial layer 206T of the sacrificial layers 206 may be thicker than the rest of the sacrificial layers 206. The top sacrificial layer 206T is intentionally made thicker to protect the topmost channel layer 208 from unintended damages. In some instances, the top sacrificial layer 206T has a fourth thickness T4 between about 20 nm and about 50 nm. In these instances, a ratio of the fourth thickness T4 to the third thickness T3 may be between about 1.3 and about 2.5. As described in more detail below, the channel layers 208 or parts thereof may serve as channel member(s) for an MBC transistor and the second thickness T2 of each of the channel layers 208 is chosen based on device performance considerations and thickness loss during selective removal of the sacrificial layers 206. The third thickness T3 of each of the sacrificial layers 206 is selected to modulate the vertical spacing between adjacent channel members in the MBC transistor. As will be described further below, the top sacrificial layer 206T may be consumed after the patterning the stack 204.

The layers in the stack 204 may be deposited using a reduced pressure CVD (RPCVD) process, a molecular beam epitaxy (MBE) process, a vapor phase deposition (VPE) process, and/or other suitable epitaxial growth processes. Formation of different layers in the stack 204 may include use of different combination of precursors and process temperatures. For example, formation of the buffer layer 203 may include use of germane (GeH$_4$) and a process temperature between about 300° C. and about 500° C. Formation of the sacrificial layers 206 may include use of germane (GeH$_4$) and boron trichloride (BCl$_3$) and a process temperature between about 250° C. and about 400° C. Formation of the channel layers 208 may include use of germane (GeH$_4$) and tin tetrachloride (SnCl$_4$) and a process temperature between about 250° C. and about 400° C. In some embodiments, after the deposition of the buffer layer 203, an anneal process may be performed to improve the quality of the buffer layer 203. In some instances, the anneal process has an anneal temperature between about 700° C. and about 800 C.

Figure 3:
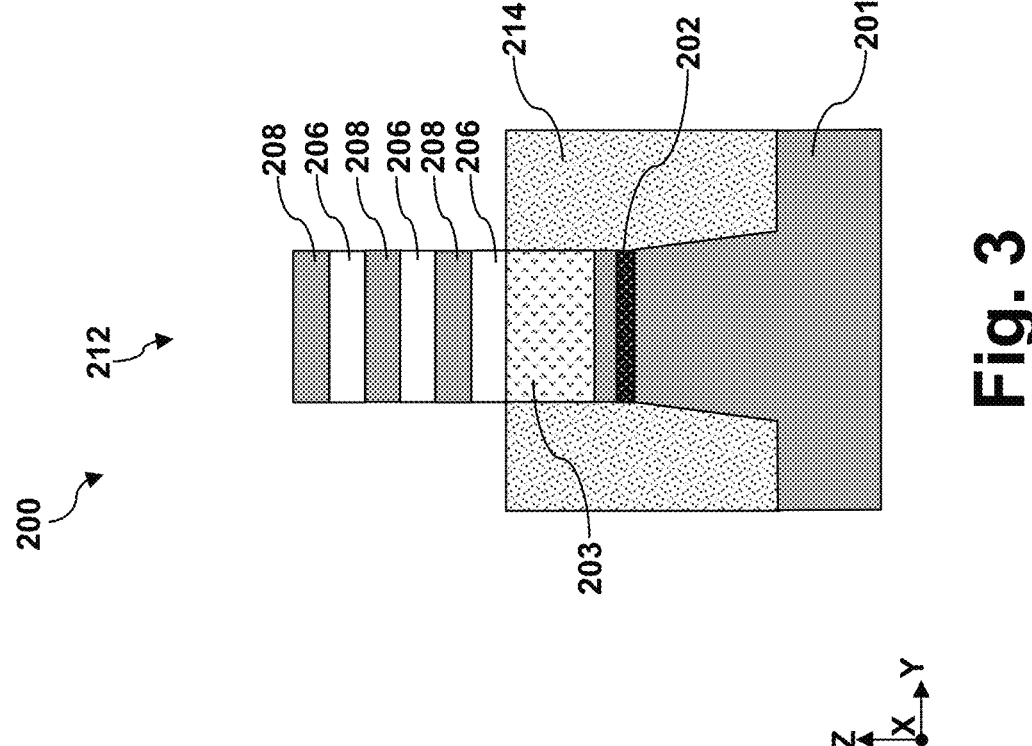

Referring still to FIGS. 1, 2 and 3, method 100 includes a block 104 where a fin-shaped structure 212 is formed from the stack 204 and the substrate 201. To pattern the stack 204, a hard mask layer 210 (shown in FIG. 2) may be deposited over the stack 204 to form an etch mask. The hard mask layer 210 may be a single layer or a multi-layer. For example, the hard mask layer 210 may include a pad oxide layer and a pad nitride layer over the pad oxide layer. The fin-shaped structure 212 may be patterned from the stack 204, the buffer layer 203 and the substrate 201 using a lithography process and an etch process. The lithography process may include photoresist coating (e.g., spin-on coating), soft baking, mask aligning, exposure, post-exposure baking, photoresist developing, rinsing, drying (e.g., spin-drying and/or hard baking), other suitable lithography techniques, and/or combinations thereof. In some embodiments, the etch process may include dry etching (e.g., RIE etching), wet etching, and/or other etching methods. As shown in FIG. 3, the etch process at block 104 forms trenches extending through the stack 204, the buffer layer 203 and a portion of the substrate 201. The trenches define the fin-shaped structures 212. In some implementations, double-patterning or multi-patterning processes may be used to define fin-shaped structures that have, for example, pitches smaller than what is otherwise obtainable using a single, direct photolithography process. For example, in one embodiment, a material layer is formed over a substrate and patterned using a photolithography process. Spacers are formed alongside the patterned material layer using a self-aligned process. The material layer is then removed, and the remaining spacers, or mandrels, may then be used to pattern the fin-shaped structure 212 by etching the stack 204, the buffer layer 203 and the substrate 201. As shown in FIG. 3, the fin-shaped structure 212, along with the sacrificial layers 206 and the channel layers 208 therein, extends vertically along the Z direction and lengthwise along the X direction. In some embodiments represented in FIG. 3, the top sacrificial layer 206T may be completely etched away during the formation of the fin-shaped structure 212.

An isolation feature 214 is formed adjacent the fin-shaped structure 212. In some embodiments, the isolation feature 214 may be formed in the trenches to isolate the fin-shaped structures 212 from a neighboring active region. The isolation feature 214 may also be referred to as a shallow trench isolation (STI) feature 214. By way of example, in some embodiments, a dielectric layer is first deposited over the substrate 201, filling the trenches with the dielectric layer. The dielectric layer may include silicon oxide, silicon nitride, silicon oxynitride, fluorine-doped silicate glass (FSG), a low-k dielectric, combinations thereof, and/or other suitable materials. In various examples, the dielectric layer may be deposited by a CVD process, a subatmospheric CVD (SACVD) process, a flowable CVD process, a spin-on coating process, and/or other suitable process. The deposited dielectric material is then thinned and planarized, for example by a chemical mechanical polishing (CMP) process. The planarized dielectric layer is further recessed or pulled-back by a dry etching process, a wet etching process, and/or a combination thereof to form the STI feature 214. In some embodiments represented in FIG. 3, after the recessing, a top surface of the STI feature 214 may be substantially coplanar to a top surface of the buffer layer 203. Put differently, in those embodiments, the top surface of the STI feature 214 may be substantially coplanar with a bottom surface of the bottommost sacrificial layer 206. The fin-shaped structure 212 rises above the STI feature 214 after the recessing, as shown in FIG. 3.

Figure 4:
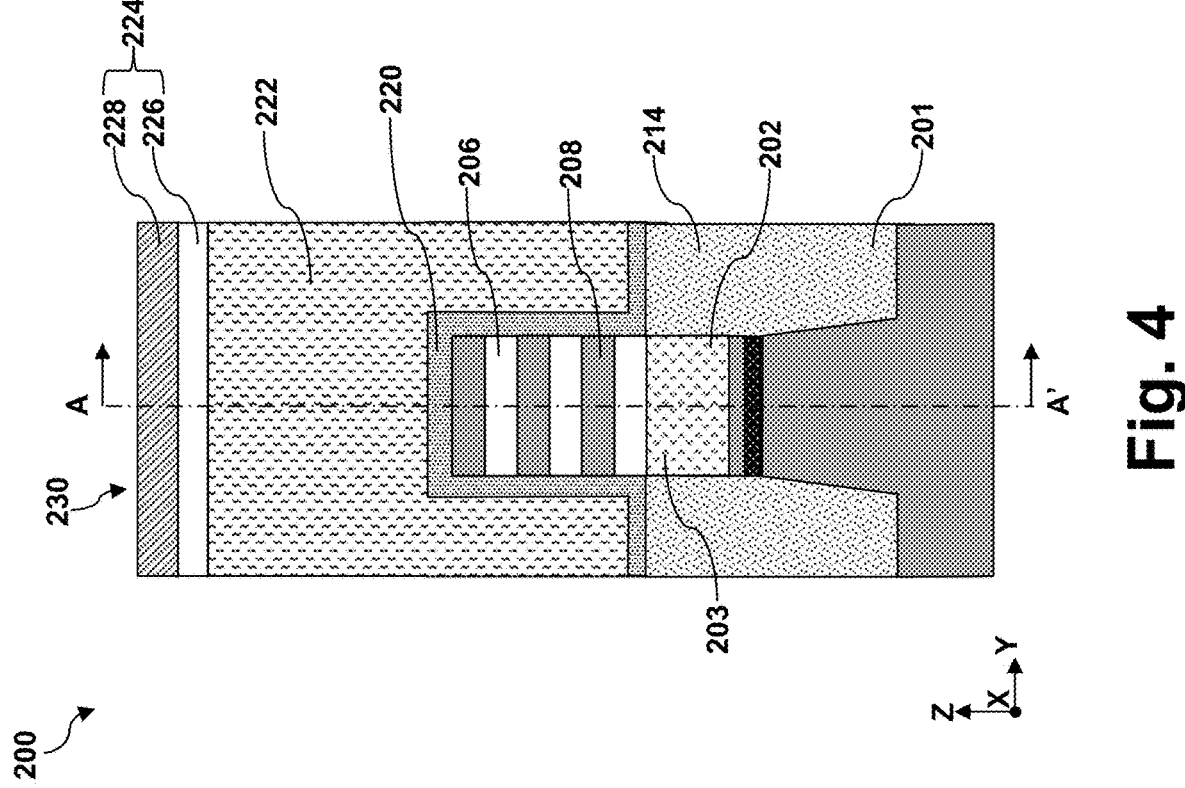
Figure 5:
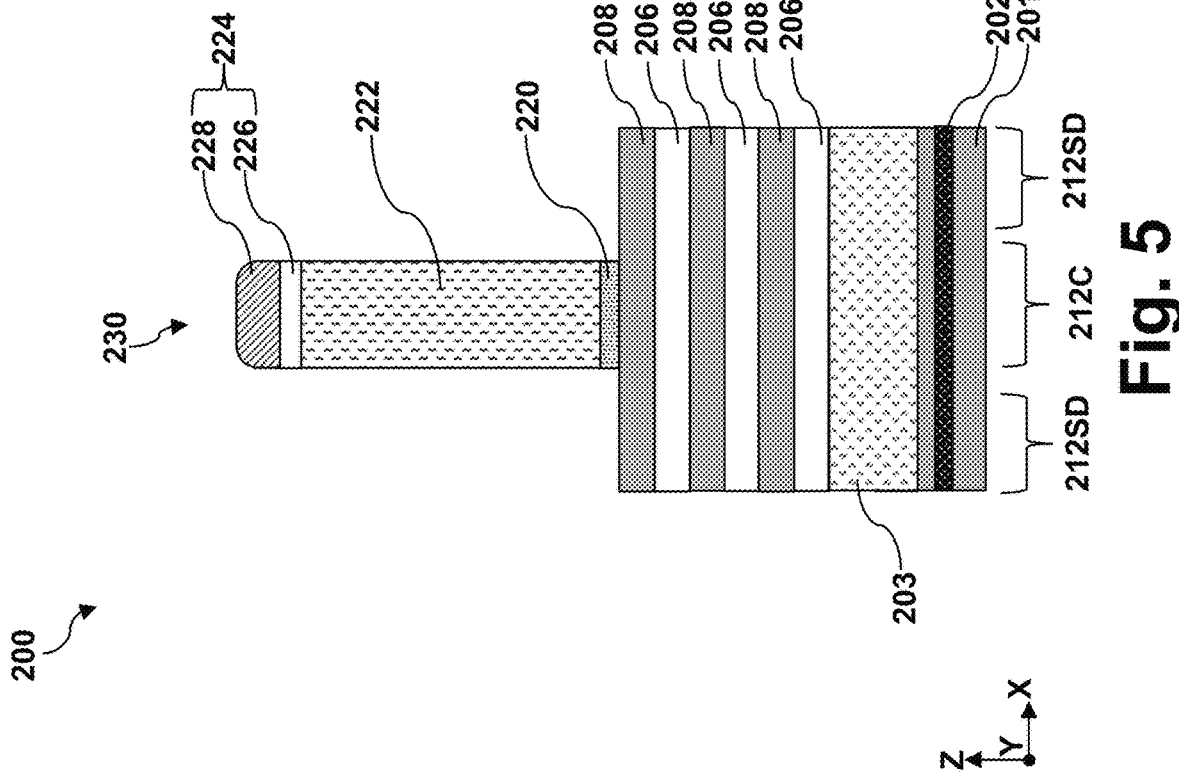

Referring to FIGS. 1, 4 and 5, method 100 includes a block 106 where a dummy gate stack 230 is formed over a channel region 212C of the fin-shaped structure 212. In some embodiments, a gate replacement process (or gate-last process) is adopted where the dummy gate stack 230 (shown in FIGS. 4 and 5) serves as a placeholder to undergo various processes and is to be removed and replaced by the functional gate structure. Other processes and configuration are possible. In some embodiments illustrated in FIG. 5, the dummy gate stack 230 is formed over the fin-shaped structure 212 and the fin-shaped structure 212 may be divided into channel regions 212C underlying the dummy gate stacks 230 and source/drain regions 212SD that do not underlie the dummy gate stacks 230. The channel regions 212C are adjacent the source/drain regions 212SD. As shown in FIG. 5, the channel region 212C is disposed between two source/drain regions 212SD along the X direction.

The formation of the dummy gate stack 230 may include deposition of layers in the dummy gate stack 230 and patterning of these layers. Referring to FIG. 4, a dummy dielectric layer 220, a dummy electrode layer 222, and a gate-top hard mask layer 224 may be blanketly deposited over the workpiece 200. In some embodiments, the dummy dielectric layer 220 may be formed on the fin-shaped structure 212 using a chemical vapor deposition (CVD) process, an ALD process, an oxygen plasma oxidation process, or other suitable processes. In some instances, the dummy dielectric layer 220 may include silicon oxide. Thereafter, the dummy electrode layer 222 may be deposited over the dummy dielectric layer 220 using a CVD process, an ALD process, or other suitable processes. In some instances, the dummy electrode layer 222 may include polysilicon. For patterning purposes, the gate-top hard mask layer 224 may be deposited on the dummy electrode layer 222 using a CVD process, an ALD process, or other suitable processes. The gate-top hard mask layer 224, the dummy electrode layer 222 and the dummy dielectric layer 220 may then be patterned to form the dummy gate stack 230, as shown in FIG. 5. For example, the patterning process may include a lithography process (e.g., photolithography or e-beam lithography) which may further include photoresist coating (e.g., spin-on coating), soft baking, mask aligning, exposure, post-exposure baking, photoresist developing, rinsing, drying (e.g., spin-drying and/or hard baking), other suitable lithography techniques, and/or combinations thereof. In some embodiments, the etching process may include dry etching (e.g., RIE etching), wet etching, and/or other etching methods. In some embodiments, the gate-top hard mask layer 224 may include a silicon oxide layer 226 and a silicon nitride layer 228 over the silicon oxide layer 226. As shown in FIG. 5, no dummy gate stack 230 is disposed over the source/drain region 212SD of the fin-shaped structure 212.

Figure 6:
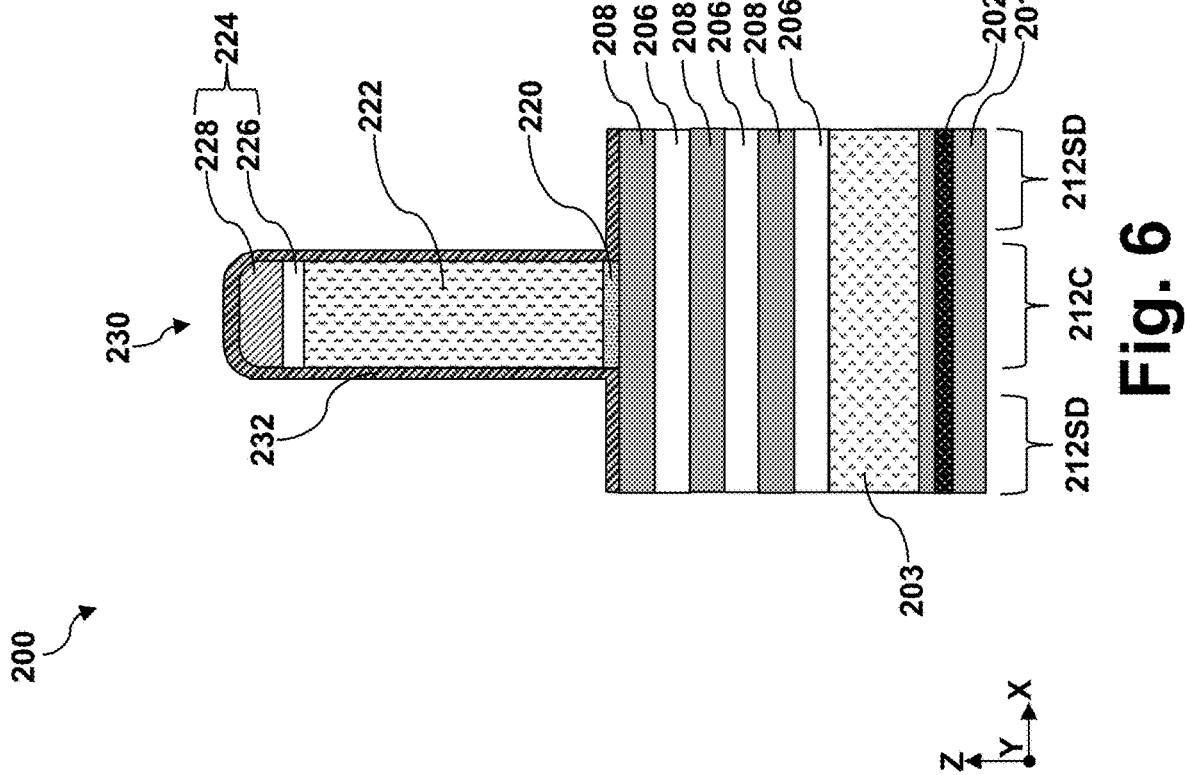

Referring to FIGS. 1 and 6, method 100 includes a block 108 where a gate spacer layer 232 is deposited over the dummy gate stack 230. In some embodiments, the gate spacer layer 232 is deposited conformally over the workpiece 200, including over top surfaces and sidewalls of the dummy gate stack 230. The term "conformally" may be used herein for ease of description of a layer having substantially uniform thickness over various regions. The gate spacer layer 232 may be a single layer or a multi-layer. The at least one layer in the gate spacer layer 232 may include silicon carbonitride, silicon oxycarbide, silicon oxycarbonitride, or silicon nitride. The gate spacer layer 232 may be deposited over the dummy gate stack 230 using processes such as, a CVD process, a subatmospheric CVD (SACVD) process, an ALD process, or other suitable process.

Figure 7:
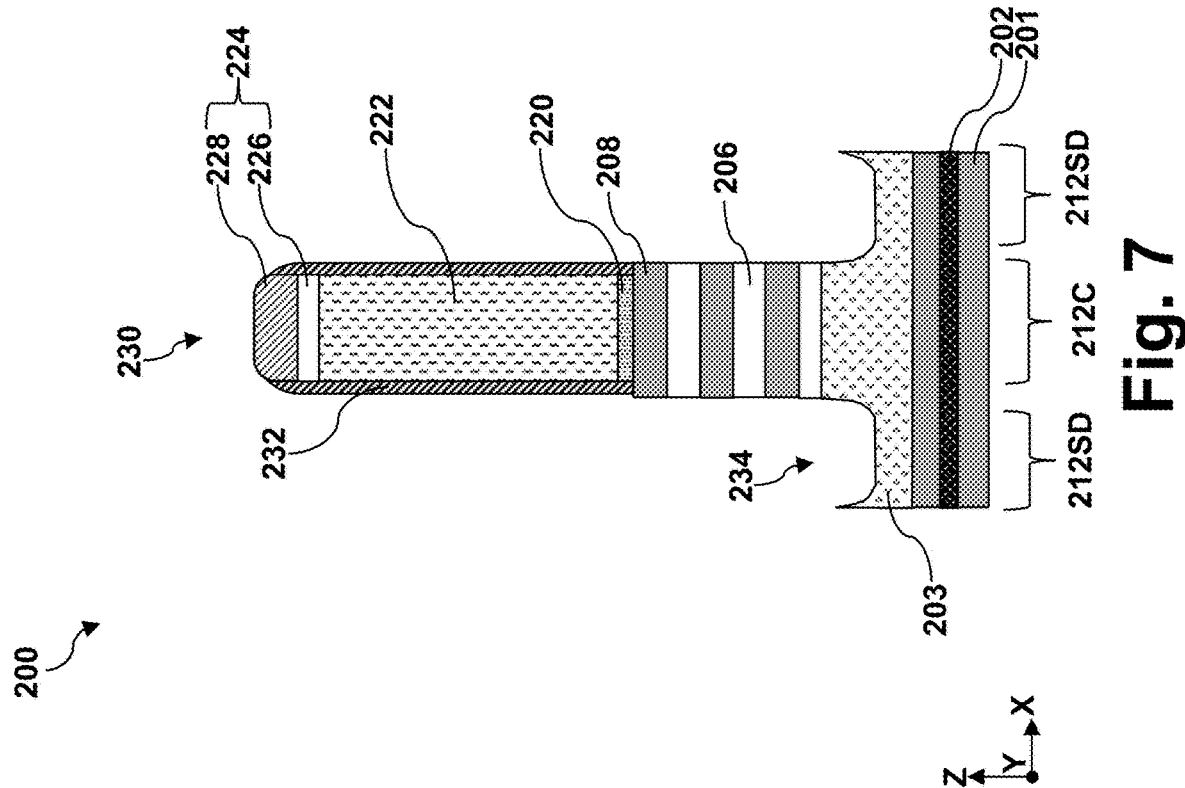

Referring to FIGS. 1 and 7, method 100 includes a block 110 where a source/drain region 212SD of the fin-shaped structure 212 is recessed to form a source/drain trench 234. In some embodiments, the source/drain regions 212SD that are not covered by the dummy gate stack 230 and the gate spacer layer 232 are etched by a dry etch or a suitable etching process to form the source/drain trenches 234. For example, the dry etch process may implement an oxygen-containing gas, a fluorine-containing gas (e.g., $CF_4$, $SF_6$, $CH_2F_2$, $CHF_3$, and/or $C_2F_6$), a chlorine-containing gas (e.g., $Cl_2$, $CHCl_3$, $CCl_4$, and/or $BCl_3$), a bromine-containing gas (e.g., HBr and/or CHBR3), an iodine-containing gas, other suitable gases and/or plasmas, and/or combinations thereof. The source/drain regions 212SD of the fin-shaped structure 212 are recessed to expose sidewalls of the sacrificial layers 206 and the channel layers 208. In the depicted embodiments, the source/drain trenches 234 extend downward through the stack 204 and partially into the buffer layer 203. As shown in FIG. 7, top surfaces and sidewalls surfaces of the buffer layer 203 are also exposed in the source/drain trenches 234. FIG. 7 illustrates a cross-sectional view of the workpiece 200 viewed along the Y direction at the source/drain region 212SD.

Figure 8:
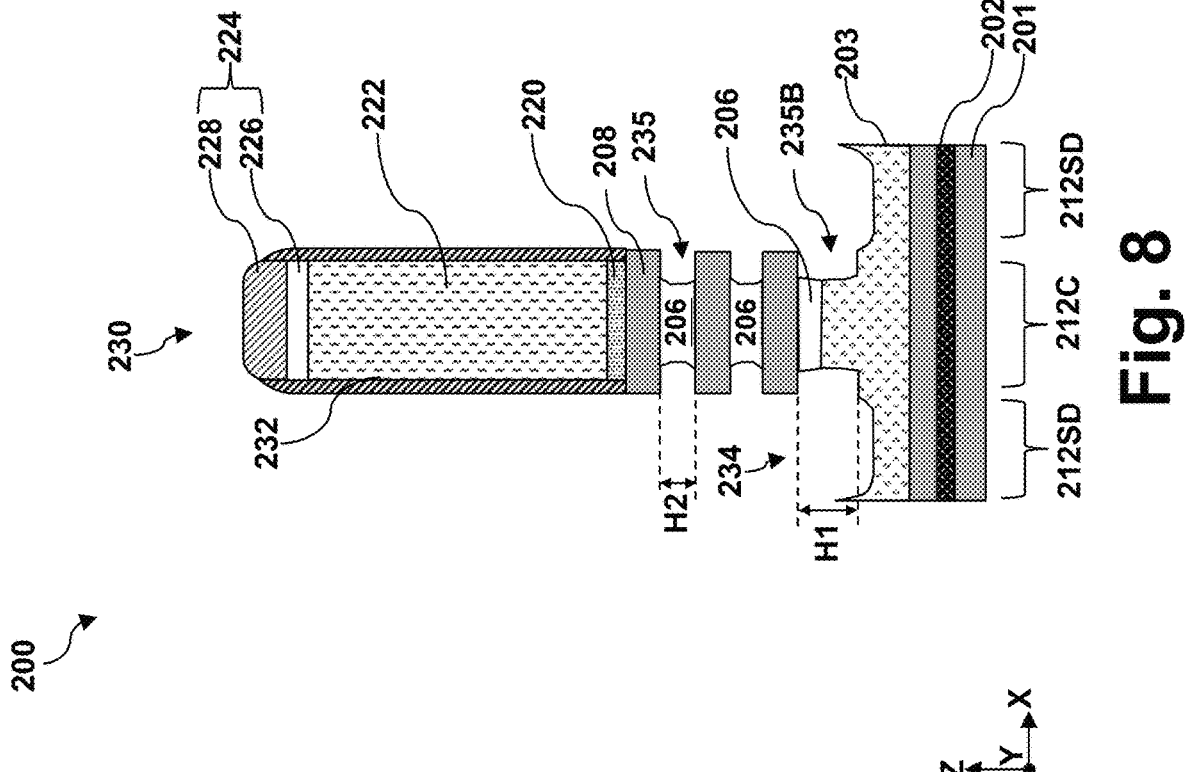
Figure 9:
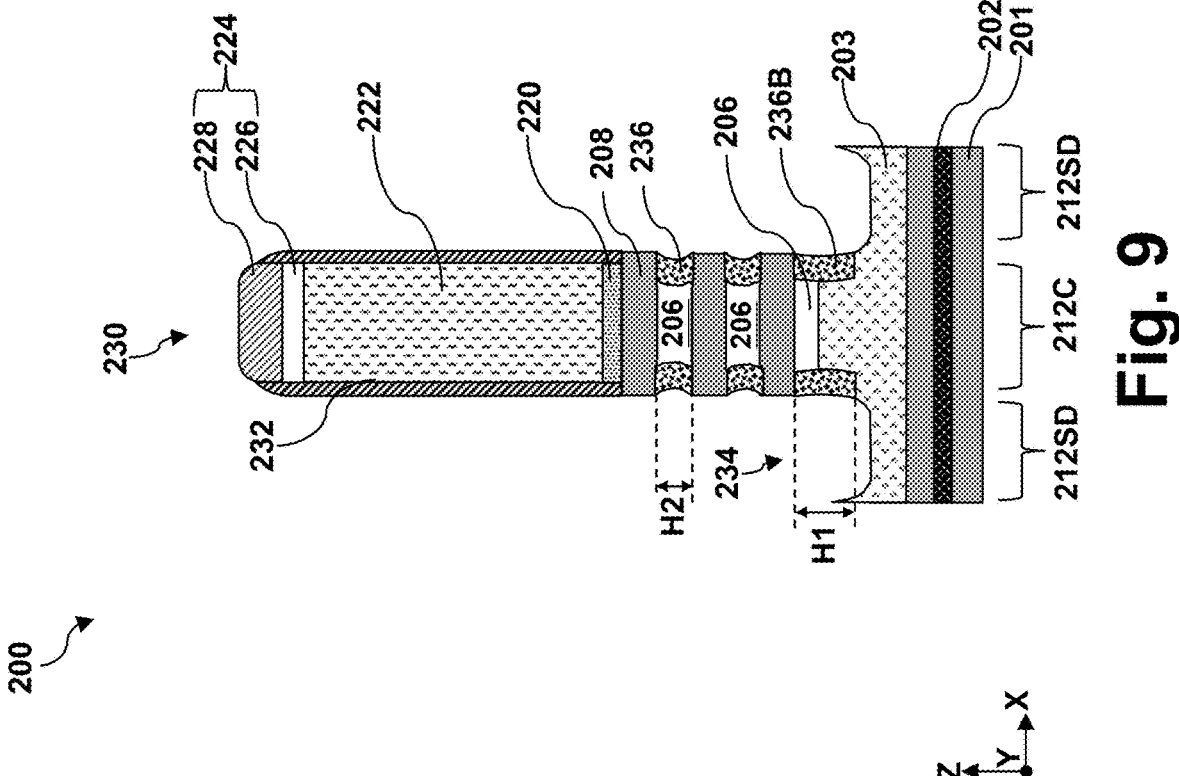

Referring to FIGS. 1, 8 and 9, method 100 includes a block 112 where inner spacer features 236 are formed. While not shown explicitly, operations at block 112 may include selective and partial removal of the sacrificial layers 206 to form inner spacer recesses 235, deposition of inner spacer material (i.e., material for the inner spacer features 236) over the workpiece 200, and etch back the inner spacer material to form inner spacer features 236 in the inner spacer recesses 235. While the sacrificial layers 206 may be selectively etched relative to the buffer layer 203, the etch selectivity may not be sufficiently to ensure that the exposed buffer layer 203 is not substantially etched. In the depicted embodiments represented in FIG. 8, the selective and partial recess of the sacrificial layers 206 also etches the buffer layer 203 while the gate spacer layer 232 and the channel layers 208 are substantially unetched. As a result, the bottommost inner spacer recesses 235B in FIG. 8 also extend into the buffer layer 203. In an embodiment where the channel layers 208 include germanium-tin (GeSn) or silicon germanium (SiGe)

and sacrificial layers 206 includes doped germanium, such as boron-doped germanium (Ge:B), the selective recess of the sacrificial layers 206 may be performed using a selective wet etch process or a selective dry etch process. In some embodiments, the selective dry etching process may include use of one or more fluorine-based etchants, such as fluorine gas or hydrofluorocarbons. The selective wet etching process may include use of hydrogen peroxide or an APM etch (e.g., ammonia hydroxide-hydrogen peroxide-water mixture).

Referring to FIG. 9, after the inner spacer recesses 235 and bottom inner spacer recesses 235B are formed, the inner spacer material is deposited over the workpiece 200. The inner spacer material may include metal oxides, silicon oxide, silicon oxycarbonitride, silicon nitride, silicon oxynitride, carbon-rich silicon carbonitride, or a low-k dielectric material. The metal oxides may include aluminum oxide, zirconium oxide, tantalum oxide, yttrium oxide, titanium oxide, lanthanum oxide, or other suitable metal oxide. While not explicitly shown, the inner spacer material may be a single layer or a multilayer. In some implementations, the inner spacer material may be deposited using CVD, PECVD, SACVD, ALD or other suitable methods. The inner spacer material is deposited into the inner spacer recesses as well as over the sidewalls of the channel layers 208 exposed in the source/drain trenches 234. Referring to FIG. 9, the deposited inner spacer material is then etched back to remove the inner spacer material from the sidewalls of the channel layers 208 to form the inner spacer features 236 (including the bottommost inner spacer features 236B) in the inner spacer recesses 235 (including the bottom inner spacer recesses 235B). At block 112, the inner spacer material may also be removed from the top surfaces and/or sidewalls of the gate-top hard mask layer 224 and the gate spacer layer 232. In some implementations, the etch back operations performed at block 112 may include use of hydrogen fluoride (HF), fluorine gas ($F_2$), hydrogen ($H_2$), ammonia ($NH_3$), nitrogen trifluoride ($NF_3$), or other fluorine-based etchants. As shown in FIG. 9, each of the inner spacer features 236 is in direct contact with the recessed sacrificial layers 206. Additionally, each of the inner spacer features 236 is disposed between and in direct contact with two adjacent channel layers 208. Each of the bottommost inner spacer features 236B is disposed between and in contact with the bottommost channel layer 208 and the buffer layer 203.

As shown in FIG. 9, because the buffer layer 203 is also recessed when the sacrificial layers 206 are partially and selectively recessed, the bottommost inner spacer recesses extend into the buffer layer 203 while the recess of the other sacrificial layers 206 is confined substantially between two adjacent channel layers 208. As a result, the bottommost inner spacer features 236B vertically extends across the buffer layer 203 and the bottommost sacrificial layers 206 but the other inner spacer features 236 correspond substantially to the sacrificial layers 206. In the depicted embodiments, each of the bottommost inner spacer features 236B has a first height H1 while the other inner spacer features 236 have a second height H2. In some embodiments, the first height H1 may be between about 10 nm and about 80 nm and the second height H2 may be between about 5 nm and about 30 nm. In some instances, a ratio of the first height H1 to the second height H2 may be between about 2 and about 3. The bottommost inner spacer features 236B may also be referred to as deep inner spacer features 236B.

While not explicitly shown in the figures, the method 100 may include a cleaning process to prepare the workpiece 200 for epitaxial growth. The cleaning process may include a dry clean, a wet clean, or a combination thereof. In some examples, the wet clean may include use of standard clean 1 (RCA SC-1, a mixture of deionized (DI) water, ammonium hydroxide, and hydrogen peroxide), standard clean 2 (RCA SC-2, a mixture of DI water, hydrochloric acid, and hydrogen peroxide), SPM (a sulfuric peroxide mixture), and or hydrofluoric acid for oxide removal. The dry clean process may include helium (He) and hydrogen ($H_2$) treatment at a temperature between about 250° C. and about 550° C. and under a pressure between about 75 mTorr and about 155 mTorr. The hydrogen treatment may convert germanium on the surface to germane ($GeH_4$), which may be pumped out for removal. In some implementations, the cleaning process is configured to selectively remove or trim a portion of the channel layers without substantially removing the inner spacer features 236. The cleaning process may remove surface oxide and debris in order to ensure a clean semiconductor surface, which facilitates growth of high quality epitaxial layers at block 114.

Referring to FIGS. 1, 10, 11 and 12, method 100 includes a block 114 where source/drain features 244 are formed in the source/drain trenches 234 over the source/drain regions 212SD. In some implementations represented in FIGS. 10, 11 and 12, each of the source/drain features 244 may include a first epitaxial layer 238, a second epitaxial layer 240 over the first epitaxial layer 238, and a third epitaxial layer 242 over the second epitaxial layer 240. To form the source/drain features 244 depicted in FIG. 12, the first epitaxial layer 238, the second epitaxial layer 240, and the third epitaxial layer 242 are sequentially, epitaxially and selectively formed from the exposed sidewalls of the channel layers 208 and exposed surfaces of the buffer layer 203 while sidewalls of the sacrificial layers 206 remain covered by the inner spacer features 236. Suitable epitaxial processes for block 114 include reduced pressure CVD (RPCVD), vapor-phase epitaxy (VPE), ultra-high vacuum CVD (UHV-CVD), molecular beam epitaxy (MBE), and/or other suitable processes. The epitaxial growth process at block 114 may use gaseous precursors, which interact with the compositions of the buffer layer 203, the channel layers 208, and the second cap layers.

Figure 10:
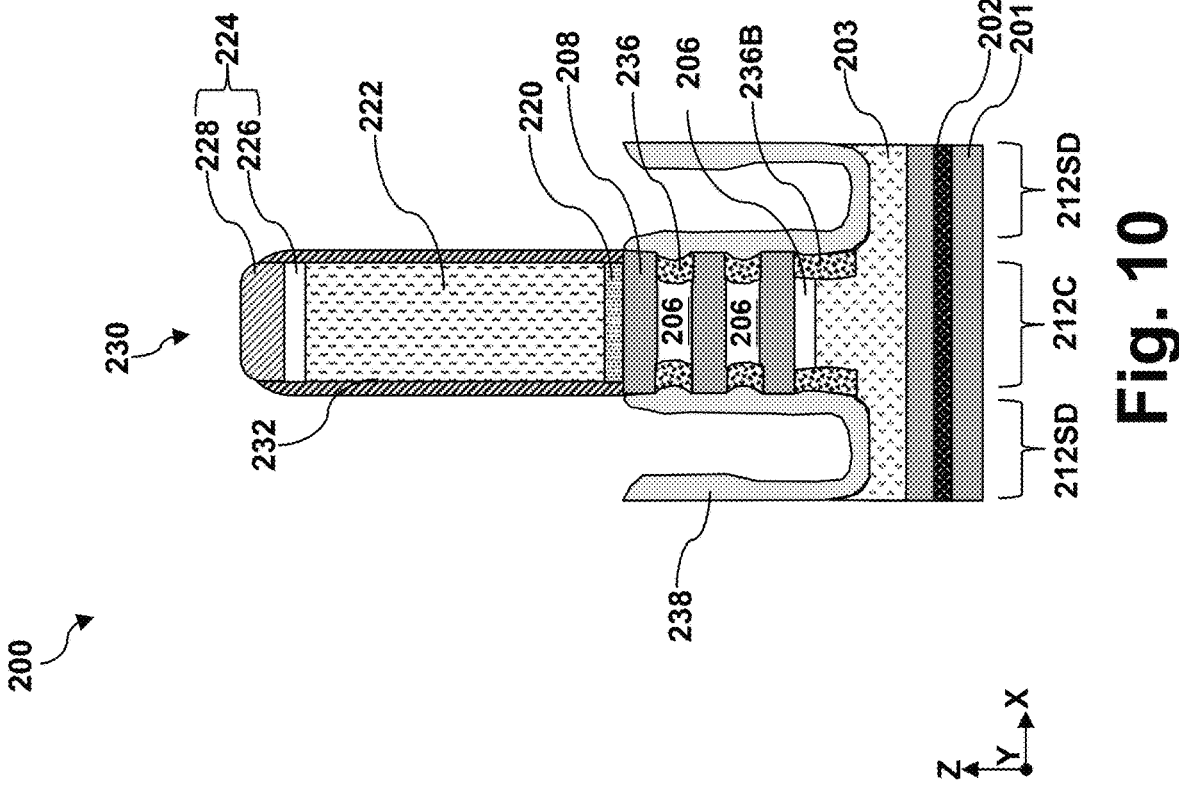

Referring to FIG. 10, the first epitaxial layer 238 is deposited in the source/drain trenches 234 over the source/drain regions 212SD. The composition of the first epitaxial layer 238 is selected such that the first epitaxial layer 238 are coupled to the sidewalls of the channel layers 208 without substantial lattice mismatch. The first epitaxial layer 238 may include germanium-tin (GeSn). In some instances, the first epitaxial layer 238 has a germanium content between about 85% and about 95% and a tin content between about 5% and about 12%. The germanium and tin contents of the first epitaxial layer 238 is slightly different from those of the channel layers 208 to exert just enough strain without causing substantial lattice mismatch. The first epitaxial layer 238 includes a dopant. When an n-type MBC transistor is desired, the first epitaxial layer 238 is doped with an n-type dopant, such as phosphorus (P) or arsenic (As). When a p-type MBC transistor is desired, the first epitaxial layer 238 is doped with a p-type dopant, such as boron (B). In the depicted embodiment, the first epitaxial layer 238 is doped with boron (B). To avoid excessive lattice mismatch with the channel layers 208, the boron dopant concentration in the first epitaxial layer 238 may be between about $1\times10^{20}$ atoms/cm$^3$ and about $5\times10^{20}$ atoms/cm$^3$. This concentration range is not trivial. When the boron concentration in the first epitaxial layer 238 is lower than about $1\times10^{20}$ atoms/cm$^3$, the resistance in the first epitaxial layer 238 may prevent satisfactory drive current (i.e., On-state current). When the boron dopant concentration in the first epitaxial layer 238 is greater than about $5 \times 10^{20}$ atoms/cm$^3$, boron in the lattice interstices may also cause too much defect at the interface between the first epitaxial layer 238 and the channel layers 208, which may lead to increased resistance. In some embodiments, as measured from the buffer layer 203 or the sidewalls of the channel layers 208, the first epitaxial layer 238 may have a thickness between 10 nm and about 30 nm. Although the epitaxial deposition of the first epitaxial layer 238 is selective to semiconductor surfaces, with the afore-mentioned thickness range, the first epitaxial layer 238 may merge over the inner spacer features 236 or even come in contact with the inner spacer features 236.

Figure 11:
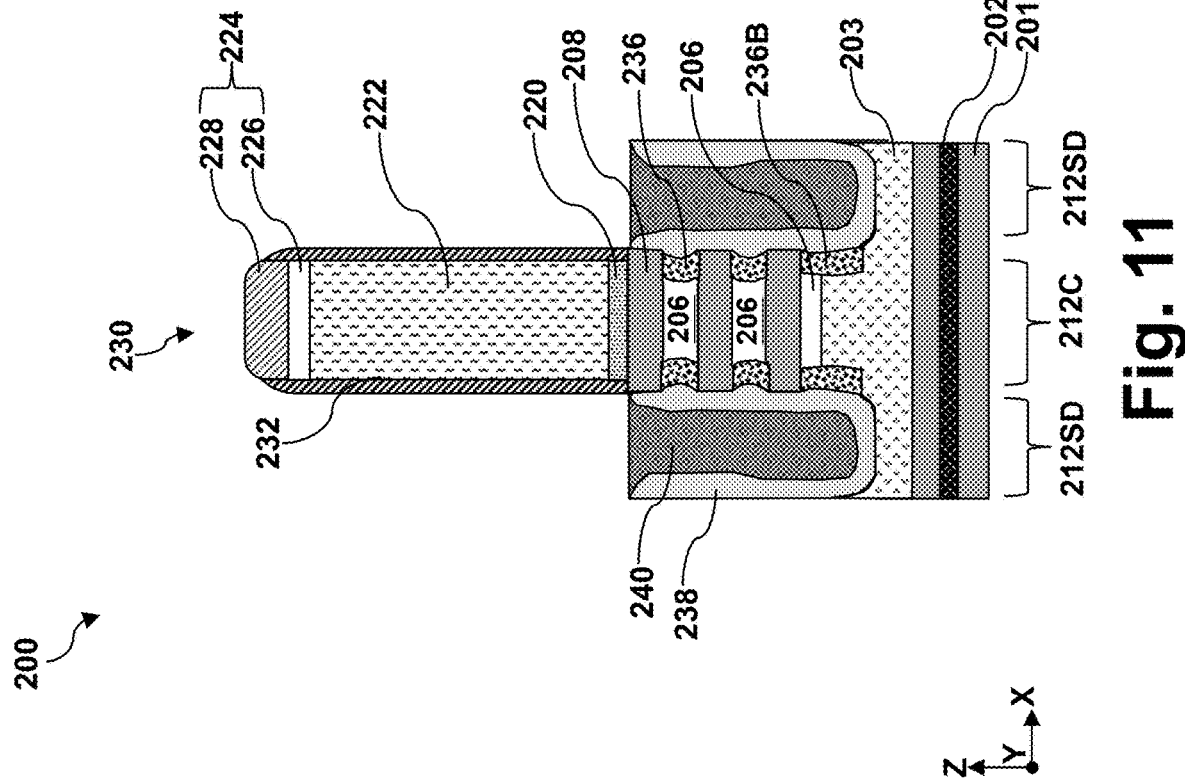

Referring to FIG. 11, the second epitaxial layer 240 is deposited over the first epitaxial layer 238. That is, the second epitaxial layer 240 is spaced apart from the channel layers 208, the inner spacer features 236, and the buffer layer 203 by the first epitaxial layer 238. The composition of the second epitaxial layer 240 is selected to exert stress on the channel layers 208 and to minimize contact resistance. Like the first epitaxial layer 238, the second epitaxial layer 240 may also include germanium-tin (GeSn). In some instances, to exert sufficient stress on the channel layers, the second epitaxial layer 240 has a germanium content between about 85% and about 95% and a tin content between about 3% and about 10%. It can be seen that the germanium and tin contents of the second epitaxial layer 240 is more different from those of the channel layers 208 than those of the first epitaxial layer 238. The second epitaxial layer 240 and the first epitaxial layer 238 have the same type of dopant. When an n-type MBC transistor is intended, the second epitaxial layer 240 is doped with an n-type dopant, such as phospho-rus (P) or arsenic (As). When a p-type MBC transistor is intended, the second epitaxial layer 240 is doped with a p-type dopant, such as boron (B). In the depicted embodi-ment, the second epitaxial layer 240 is doped with boron (B). To reduce contact resistance, the boron dopant concentration in the second epitaxial layer 240 may be between about $1 \times 10^{21}$ atoms/cm$^3$ and about $2 \times 10^{21}$ atoms/cm$^3$. This con-centration range is not trivial. When the boron concentration in the second epitaxial layer 240 is lower than about $1 \times 10^{21}$ atoms/cm$^3$, the resistance in the second epitaxial layer 240 may prevent satisfactory drive current (i.e., On-state cur-rent). The boron dopant concentration in the second epitaxial layer 240 may not be greater than about $2 \times 10^{21}$ atoms/cm$^3$ due to the solubility limit of boron in germanium-tin lattice. In some embodiments, as measured from surfaces of the first epitaxial layer 238, the second epitaxial layer 240 may have a thickness between 30 nm and about 80 nm. The thickness or volume of the second epitaxial layer 240 is maximized to maximize the stress on the channel layers 208 and minimize contact resistance. The thickness of the second epitaxial layer 240 is greater than that of the first epitaxial layer 238 or the third epitaxial layer 242.

Figure 12:
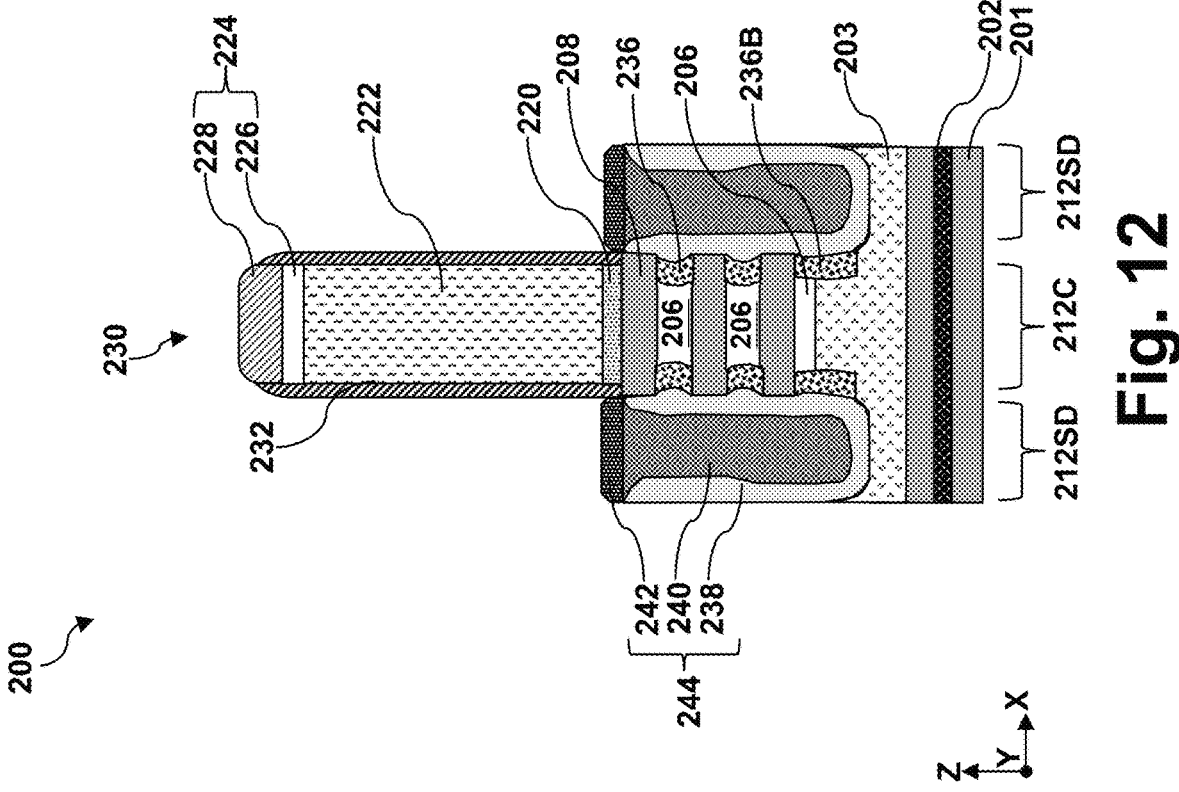

Referring to FIG. 12, the third epitaxial layer 242 is deposited over the second epitaxial layer 240. The third epitaxial layer 242 serves as a capping layer to protect the second epitaxial layer 240 when source/drain contact open-ings are formed. Therefore, the composition of the third epitaxial layer 242 is selected to be etch resistant. The third epitaxial layer 242 may be formed of silicon-germanium-tin (SiGeSn). In other words, the third epitaxial layer 242 may include silicon, germanium and tin. In some instances, to ensure sufficient etch resistance, the third epitaxial layer 242 has a germanium content between about 5% and about 25%, a tin content between about 0% and about 2%, and a silicon content between about 73% and about 95%. It can be seen that the third epitaxial layer 242 includes silicon while the first epitaxial layer 238 and the second epitaxial layer 240 includes little or no silicon. The third epitaxial layer 242 and the first epitaxial layer 238 have the same type of dopant. When an n-type MBC transistor is intended, the third epitaxial layer 242 is doped with an n-type dopant, such as phosphorus (P) or arsenic (As). When a p-type MBC tran-sistor is intended, the third epitaxial layer 242 is doped with a p-type dopant, such as boron (B). In the depicted embodi-ment, the third epitaxial layer 242 is doped with boron (B). In some instances, the boron dopant concentration in the third epitaxial layer 242 may be between about $1 \times 10^{20}$ atoms/cm$^3$ and about $5 \times 10^{20}$ atoms/cm$^3$. This dopant con-centration range may be similar to that of the first epitaxial layer 238. In some embodiments, as measured from surfaces of the second epitaxial layer 240, the third epitaxial layer 242 may have a thickness between about 3 nm and about 10 nm. The thickness of the third epitaxial layer 242 is not trivial either. When the thickness of the third epitaxial layer 242 is smaller than 3 nm, the third epitaxial layer 242 may not adequately protect the second epitaxial layer 240. When the thickness of the third epitaxial layer 242 is greater than 10 nm, residual third epitaxial layer 242 may be present in the conduction path to the source/drain contact and increase contact resistance. As shown in FIG. 12, over a source/drain region 212SD, the first epitaxial layer 238, the second epitaxial layer 240, and the third epitaxial layer 242 may be collectively referred to as a source/drain feature 244 throughout the present disclosure.

While not explicitly illustrated, method 100 may include an anneal process after the formation of the source/drain feature 244. In some implementation, the anneal process may include a rapid thermal anneal (RTA) process, a laser spike anneal process, a flash anneal process, or a furnace anneal process. The anneal process may include a peak anneal temperature between about 900° C. and about 1000° C. In these implementations, the peak anneal temperature may be maintained for a duration measured by seconds or microseconds. Through the anneal process a desired elec-tronic contribution of the dopant in the semiconductor host, such as germanium-tin (GeSn), may be obtained. The anneal process may generate vacancies that facilitate movement of the dopant from interstitial sites to substitutional lattice sites and reduce damages or defects in the lattice of the semi-conductor host.

Figure 13:
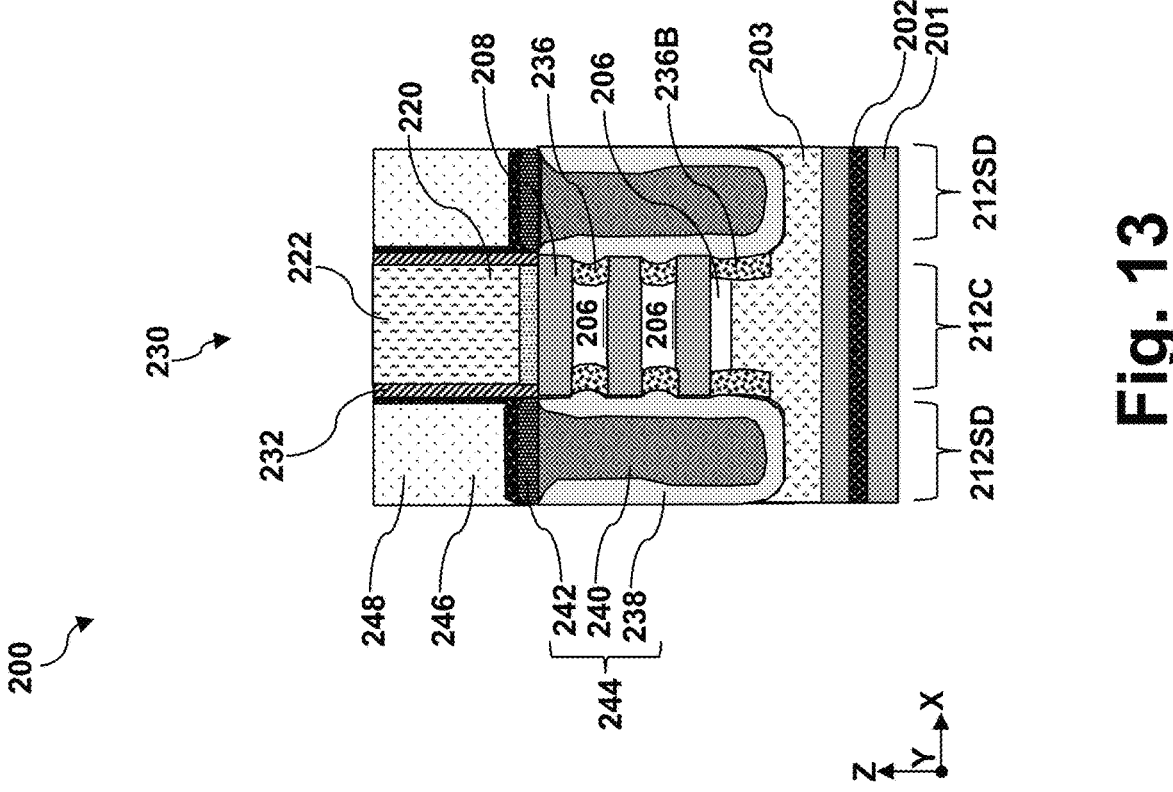

Referring to FIGS. 1 and 13, method 100 includes a block 116 where a contact etch stop layer (CESL) 246 and an interlayer dielectric layer 248 are deposited. The CESL 246 is formed prior to forming the ILD layer 248. In some examples, the CESL 246 includes silicon nitride, silicon oxynitride, and/or other materials known in the art. The CESL 246 may be formed using ALD, plasma-enhanced chemical vapor deposition (PECVD) and/or other suitable deposition processes. The ILD layer 248 is then deposited over the CESL 246. In some embodiments, the ILD layer 248 includes materials such as tetraethylorthosilicate (TEOS) oxide, un-doped silicate glass, or doped silicon oxide such as borophosphosilicate glass (BPSG), fused silica glass (FSG), phosphosilicate glass (PSG), boron doped silicon glass (BSG), and/or other suitable dielectric materi-als. The ILD layer 248 may be deposited by a PECVD process or other suitable deposition technique. In some embodiments, after formation of the ILD layer 248, the workpiece 200 may be annealed to improve integrity of the ILD layer 248. As shown in FIGS. 13, the CESL 246 may be disposed directly on top surfaces of the third epitaxial layer 242. Referring still to FIG. 13, after the deposition of the CESL 246 and the ILD layer 248, the workpiece 200 may be planarized by a planarization process to expose the dummy gate stack 230. For example, the planarization process may include a chemical mechanical planarization (CMP) process.

Figure 14:
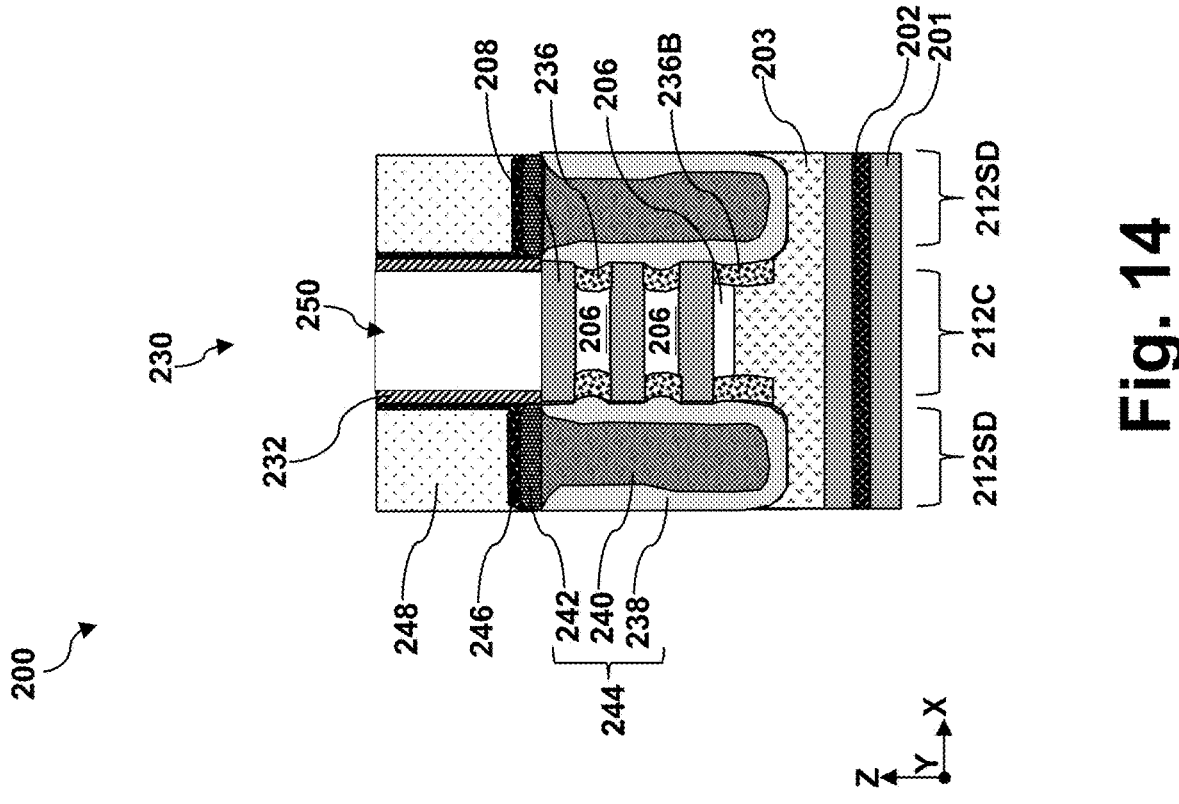
Figure 15:
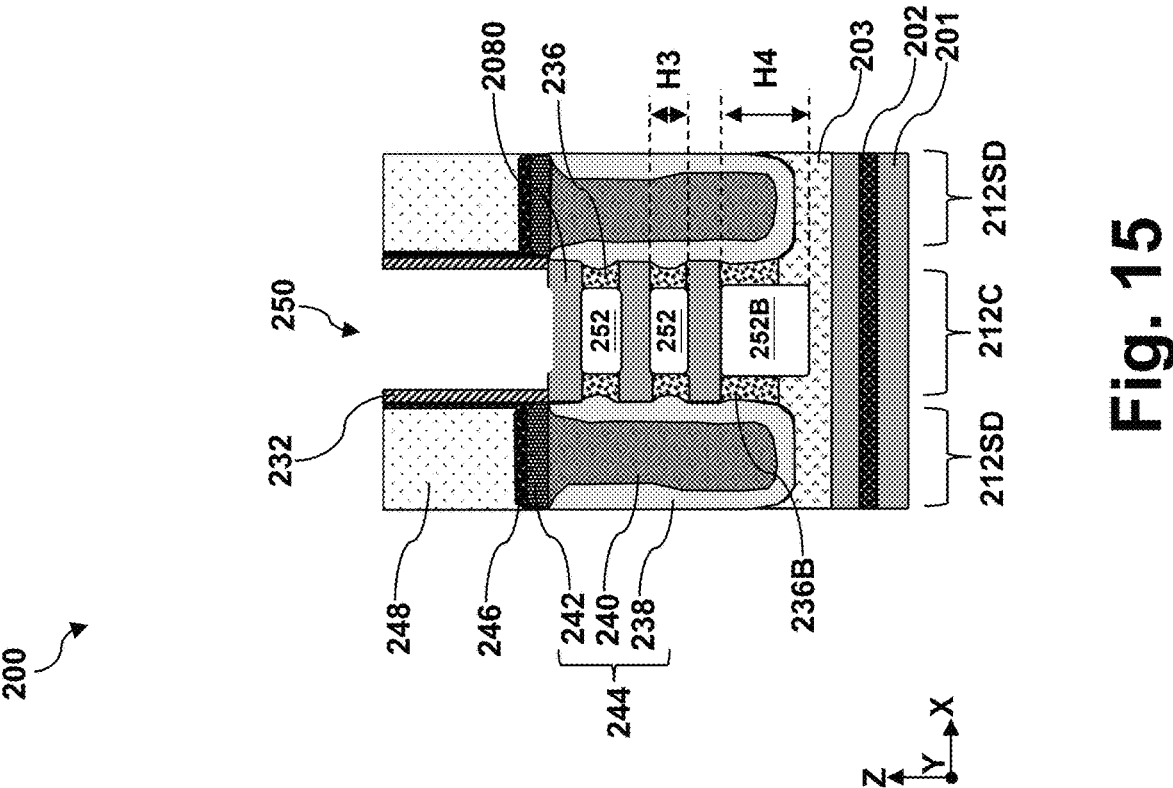

Referring to FIGS. 1 and 14, method 100 includes a block 118 where the dummy gate stack 230 is removed. Exposure of the dummy gate stack 230 at block 116 allows the removal of the dummy gate stack 230 as shown in FIG. 14 and release of the channel layers 208 as illustrated in FIG. 15. In some embodiments, the removal of the dummy gate stack 230 results in a gate trench 250 over the channel regions 212C. The removal of the dummy gate stack 230 may include one or more etching processes that are selective to the material of the dummy gate stack 230. For example, the removal of the dummy gate stack 230 may be performed using as a selective wet etch, a selective dry etch, or a combination thereof that is selective to the dummy gate stack 230. After the removal of the dummy gate stack 230, sidewalls of the channel layers 208 and the sacrificial layers 206 in the channel region 212C are exposed in the gate trench 250.

Referring to FIGS. 1 and 15, method 100 includes a block 120 where the sacrificial layers 206 are selectively removed to release the channel layers 208 as channel members 2080. The selective removal of the sacrificial layers 206 leaves behind space 252 between channel members 2080. The presence of the spaces 252 means that the channel members 2080 extend along the X direction between two source/drain features 244 like suspension bridges. The selective removal of the sacrificial layers 206 may be implemented by selective dry etch, selective wet etch, or other selective etch processes. An example selective dry etching process may include use of one or more fluorine-based etchants, such as fluorine gas or hydrofluorocarbons. An example selective wet etching process may include use of hydrogen peroxide or an APM etch (e.g., ammonia hydroxide-hydrogen peroxide-water mixture). The etching of the sacrificial layers 206 at block 120 also etches the buffer layer 203 in the channel region 212C. As a result, a bottom space 252B below of the bottommost channel member 2080 is higher than that of the space 252. In the depicted embodiments, the space 252 has a third height H3 and the bottom space 252B has a fourth height H4 greater than the third height H3. In some instances, the third height H3 generally corresponds to the third thickness T3 of the sacrificial layers 206 and may be between about 5 nm and about 30 nm. The fourth height H4 may be between about 55 nm and about 240 nm. A ratio of the fourth height H4 to the third height H3 may be between about 2 and about 8. To ensure that the sacrificial layers 206 are sufficiently removed to release the channel layers 208 as channel members, the etching at block 120 tend to etch further into the buffer layer 203. In some extreme cases, the etching at block 120 may completely remove the buffer layer 203 in the channel region 212C, thereby exposing a top surface of the substrate 201.

Figure 16:
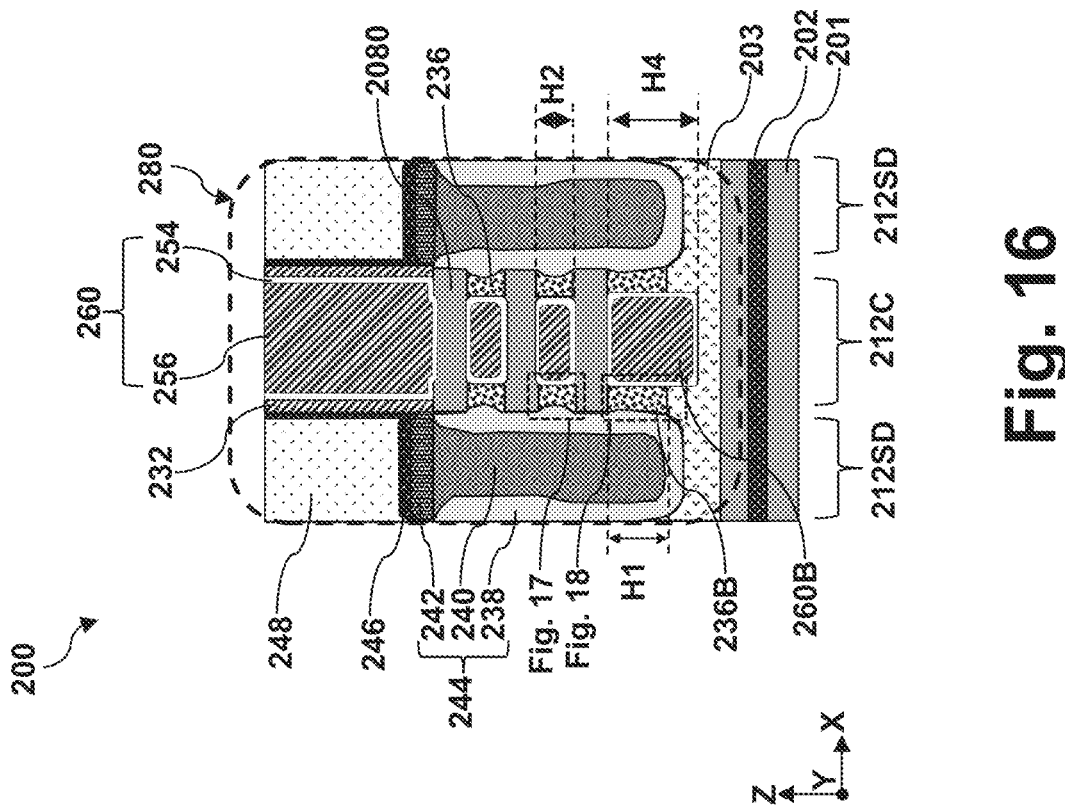

Referring to FIGS. 1 and 16, method 100 includes a block 122 where a gate structure 260 is formed to wrap around each of the channel members 2080. In some embodiments, the gate structure 260 is formed within the gate trench 250 and into the spaces 252/252B left behind by the removal of the sacrificial layers 206. In this regard, the gate structure 260 wraps around each of the channel members 2080. The gate structure 260 includes a gate dielectric layer 254 and a gate electrode layer 256 over the gate dielectric layer 254. As representatively shown in FIGS. 17 and 18, the gate dielectric layer 254 includes an interfacial layer 2540 and a high-k gate dielectric layer 2542. High-k dielectric materials, as used and described herein, include dielectric materials having a high dielectric constant, for example, greater than that of thermal silicon oxide (~3.9). The interfacial layer 2540 may include a dielectric material such as silicon oxide, germanium oxide, germanium-tin oxide, hafnium silicate, or silicon oxynitride. The interfacial layer 2540 may be formed by chemical oxidation, thermal oxidation, atomic layer deposition (ALD), chemical vapor deposition (CVD), and/or other suitable method. The high-k gate dielectric layer 2542 may include hafnium oxide. Alternatively, the high-k gate dielectric layer may include other high-k dielectric materials, such as titanium oxide ($TiO_2$), hafnium zirconium oxide (HfZrO), tantalum oxide ($Ta_2O_5$), hafnium silicon oxide ($HfSiO_4$), zirconium oxide ($ZrO_2$), zirconium silicon oxide ($ZrSiO_2$), lanthanum oxide ($La_2O_3$), aluminum oxide ($Al_2O_3$), zirconium oxide (ZrO), yttrium oxide ($Y_2O_3$), $SrTiO_3$ (STO), $BaTiO_3$ (BTO), BaZrO, hafnium lanthanum oxide (HfLaO), lanthanum silicon oxide (LaSiO), aluminum silicon oxide (AlSiO), hafnium tantalum oxide (HfTaO), hafnium titanium oxide (HfTiO), (Ba, Sr)$TiO_3$ (BST), silicon nitride (SiN), silicon oxynitride (SiON), combinations thereof, or other suitable material. The high-k gate dielectric layer may be formed by ALD, physical vapor deposition (PVD), CVD, oxidation, and/or other suitable methods.

The gate electrode layer 256 of the gate structure 260 may include a single layer or alternatively a multi-layer structure, such as various combinations of a metal layer with a selected work function to enhance the device performance (work function metal layer), a liner layer, a wetting layer, an adhesion layer, a metal alloy or a metal silicide. By way of example, the gate electrode layer 256 may include titanium nitride (TiN), titanium aluminum (TiAl), titanium aluminum nitride (TiAlN), tantalum nitride (TaN), tantalum aluminum (TaAl), tantalum aluminum nitride (TaAlN), tantalum aluminum carbide (TaAlC), tantalum carbonitride (TaCN), aluminum (Al), tungsten (W), nickel (Ni), titanium (Ti), ruthenium (Ru), cobalt (Co), platinum (Pt), tantalum carbide (TaC), tantalum silicon nitride (TaSiN), copper (Cu), other refractory metals, or other suitable metal materials or a combination thereof. In various embodiments, the gate electrode layer 256 may be formed by ALD, PVD, CVD, e-beam evaporation, or other suitable process. In various embodiments, a CMP process may be performed to remove excessive metal, thereby providing a substantially planar top surface of the gate structure 260. The gate structure 260 includes portions that interpose between channel members 2080 in the channel region 212C.

Referring to FIG. 16, the gate structure 260 fills the spaces 252 defined between channel members 2080 and the bottom space 252B defined between the bottommost channel member 2080 and the buffer layer 203. The gate structure 260 therefore includes a bottom portion 260B below the bottommost channel member 2080. Similar to the bottom space 252B, the bottom portion 260B may have the fourth height H4, which may be between about 55 nm and about 240 nm. The bottom portion 260B of the gate structure 260 is spaced apart from bottom portions of the source/drain features 244 by the bottommost inner spacer features 236B. In some implementations, the gate structure 260 extends further into the buffer layer 203 and the source/drain features 244. That is, in these implementations, a bottom surface of the bottom portion 260B of the gate structure 260 is lower than bottom surfaces of the source/drain features 244.

Upon conclusion of the operations at block 122, an MBC transistor 280 is substantially formed. The MBC transistor 280 includes channel members 2080 that are vertically stacked along the Z direction. Each of the channel members 2080 is wrapped around by the gate structure 260. The channel members 2080 extend or are sandwiched between two source/drain features 244 along the X direction. Each of the source/drain features 244 includes the first epitaxial layer 238 in contact with the buffer layer 203 and the channel members 2080, the second epitaxial layer 240 in contact with the first epitaxial layer 238, and the third epitaxial layer 242 in contact with the second epitaxial layer 240.

Figures 17, 18:
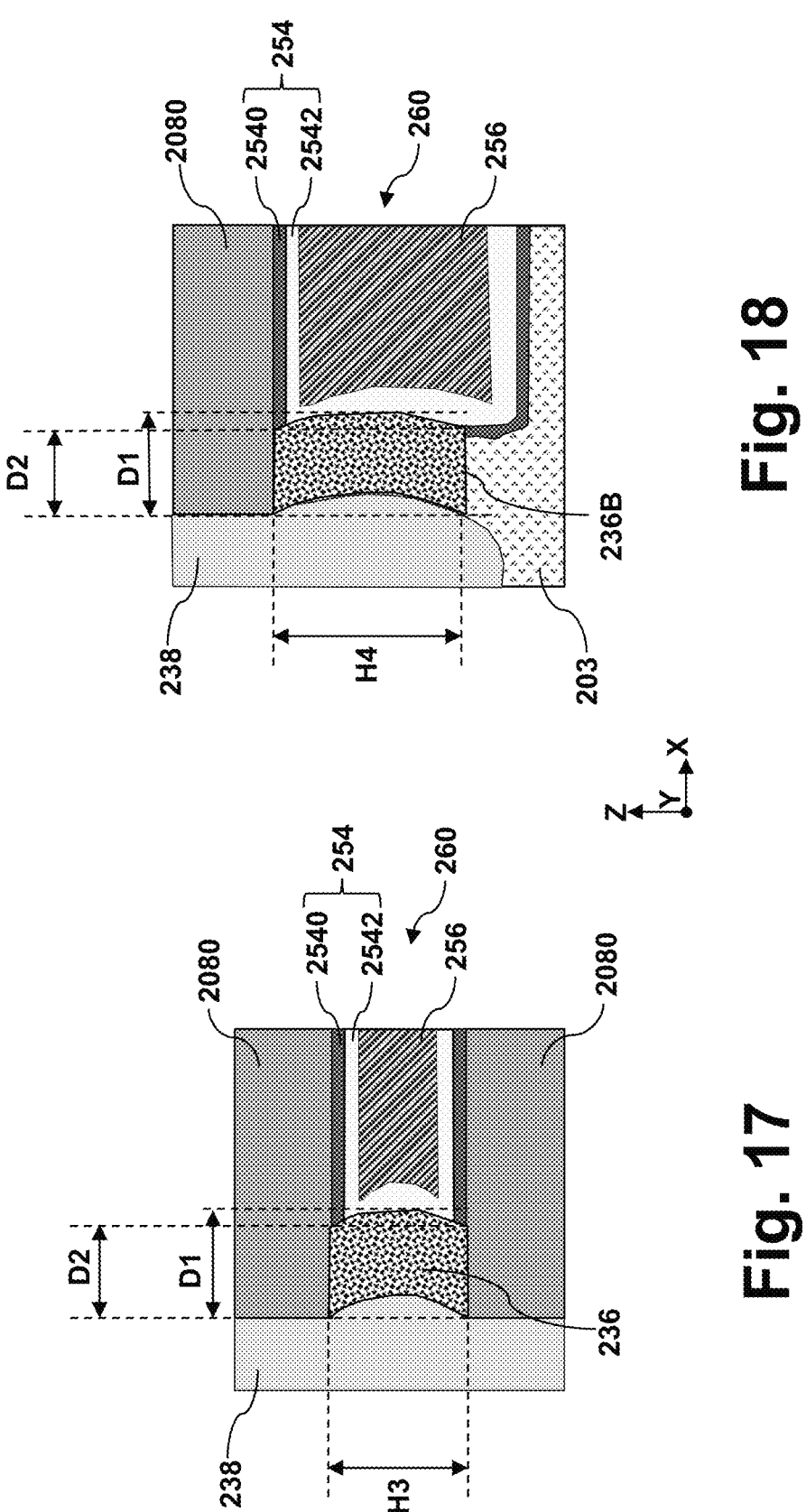
FIGS. 17 and 18 illustrate enlarged fragmentary cross-sectional views of inner spacer features, according to one or more aspects of the present disclosure.

An inner spacer feature 236 in FIG. 16 is enlarged and illustrated in FIG. 17 and a bottommost inner spacer feature 236B in FIG. 16 is enlarged and illustrated in FIG. 18. Referring to FIG. 17, each of the inner spacer features 236 (other than the bottommost ones) is disposed vertically between two channel member 2080. In the depicted embodiments, the interfacial layer 2540 is formed using an oxidation process and is disposed conformally on surfaces of the channel members 2080 that are not protected by the inner spacer feature 236. In some embodiments, the inner spacer feature 236 engages the first epitaxial layer 238 with a concave surface and engages the gate structure 260 with a convex surface. As shown in FIG. 17, the inner spacer feature 236 includes a total depth D1 and a channel-engaging depth D2 along the X direction. Here, the total depth D1 refers to the maximum depth of the inner spacer feature 236 along the X direction and the channel-engaging depth D2 refers to the depth of the inner spacer feature 236 that engages the channel members 2080. The total depth D1 is greater than the channel-engaging depth D2. In some embodiments, the total depth D1 may be between about 4 nm and about 10 nm and the channel-engaging depth D2 may be between about 2 nm and about 5 nm. A ratio of the total depth D1 to the channel-engaging depth D2 may be between about 1.5 and about 3. When the ratio of D1 to D2 is smaller than 1.5, the inner spacer feature 236 may not sufficiently prevent ingress of the gate structure 260 into the source/drain features 244 or block undesirable dopant diffusion into the gate structure 260. When the ratio of D1 to D2 is greater than 3, the gate structure 260 may not have sufficient physical engagement with the channel members 2080. As described above, the inner spacer feature 236 may have the third height H3 between about 5 nm and about 30 nm. It is noted that the shapes and profiles of the high-k gate dielectric layer 2542 and the gate electrode layer 256 may vary based on the etch selectivity of the sacrificial layers 206. In FIG. 16, the etch selectivity of the sacrificial layers 206 is smaller than 5 and a portion of the inner spacer features 236 are consumed as well. In FIG. 17, the etch selectivity of the sacrificial layers 206 is equal to or greater than 5 and the inner spacer feature 236 is substantially unetched. In the latter situation, the profiles of the inner spacer features 236 may be substantially preserved after the release of the channel members 2080.

Referring to FIG. 18, the bottommost inner spacer feature 236B is disposed vertically between the bottommost channel member 2080 and the buffer layer 203. In the depicted embodiments, the interfacial layer 2540 is formed using an oxidation process and is disposed conformally on exposed surfaces of the channel members 2080 and the buffer layer 203. In some embodiments, the inner spacer feature 236 engages the first epitaxial layer 238 with a concave surface and engages the gate structure 260 with a convex surface. As shown in FIG. 18, the bottommost inner spacer feature 236B also includes the total depth D1 and the channel-engaging depth D2 along the X direction. Here, the total depth D1 refers to the maximum depth of the bottommost inner spacer feature 236B along the X direction and the channel-engaging depth D2 refers to the depth of the bottom inner spacer feature 236B that engages the channel member 2080. The total depth D1 is greater than the channel-engaging depth D2. In some embodiments, the total depth D1 may be between about 4 nm and about 10 nm and the channel-engaging depth D2 may be between about 2 nm and about 5 nm. As described above, the bottommost inner spacer feature 236B may have the first height H1 between about 10 nm and about 80 nm. Due to the greater first height H2, the bottommost inner spacer features 236B are more elongated along the Z direction and have a greater aspect ratio (when viewed along the Y direction) than the rest of the inner spacer features 236. It is noted that the shapes and profiles of the high-k gate dielectric layer 2542 and the gate electrode layer 256 may vary based on the etch selectivity of the sacrificial layers 206. In FIG. 16, the etch selectivity of the sacrificial layers 206 is smaller than 5 and a portion of the inner spacer features 236 are consumed as well. In FIG. 18, the etch selectivity of the sacrificial layers 206 is equal to or greater than 5 and the bottommost inner spacer feature 236B is substantially unetched. In the latter situation, the profiles of the bottommost inner spacer features 236B may be substantially preserved after the release of the channel members 2080.

Figure 19:
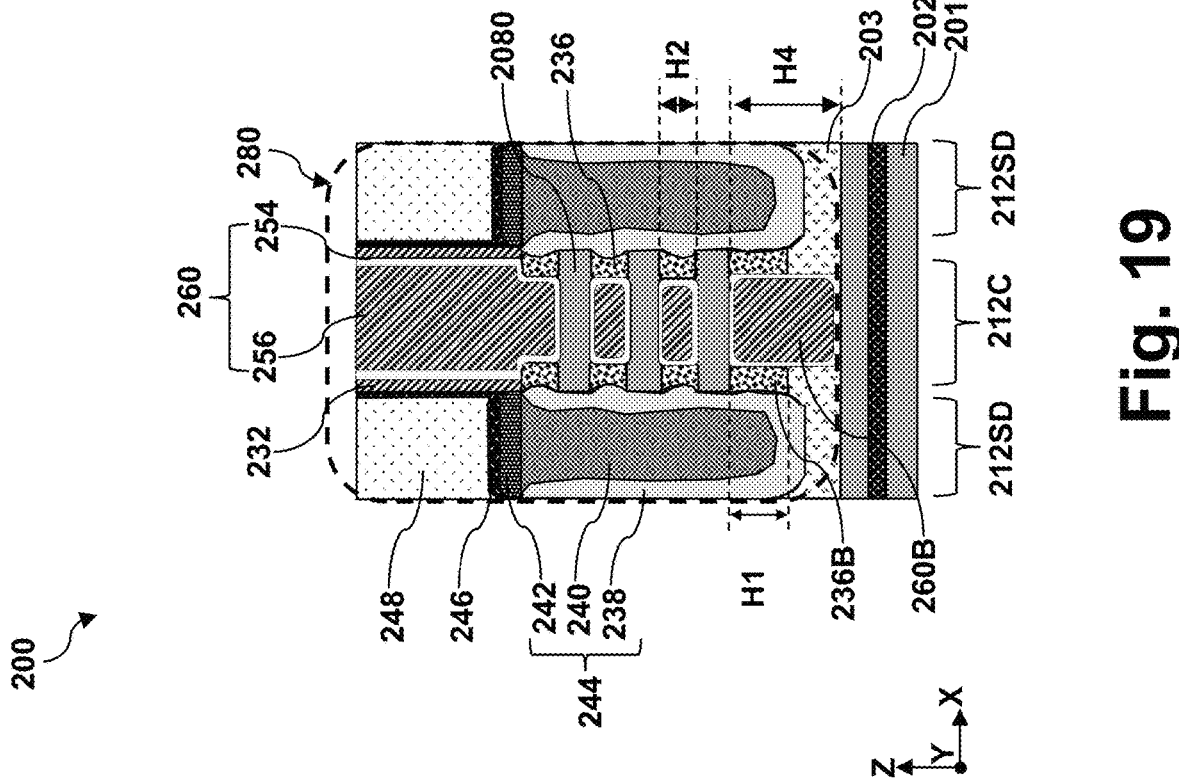
FIG. 19 illustrates a fragmentary cross-sectional view of an alternative semiconductor structure, according to one or more aspects of the present disclosure.

In some alternative embodiments illustrated in FIG. 19, the buffer layer 203 in the channel region 212C may be completely removed at block 120 to expose the substrate 201. As shown in FIG. 19, when the gate structure 260 is formed at block 120, the bottom portion 260B of the gate structure 260 may extend all the way to come in contact with a top surface of the substrate 201, which may include silicon in the depicted embodiments.

Figure 20:
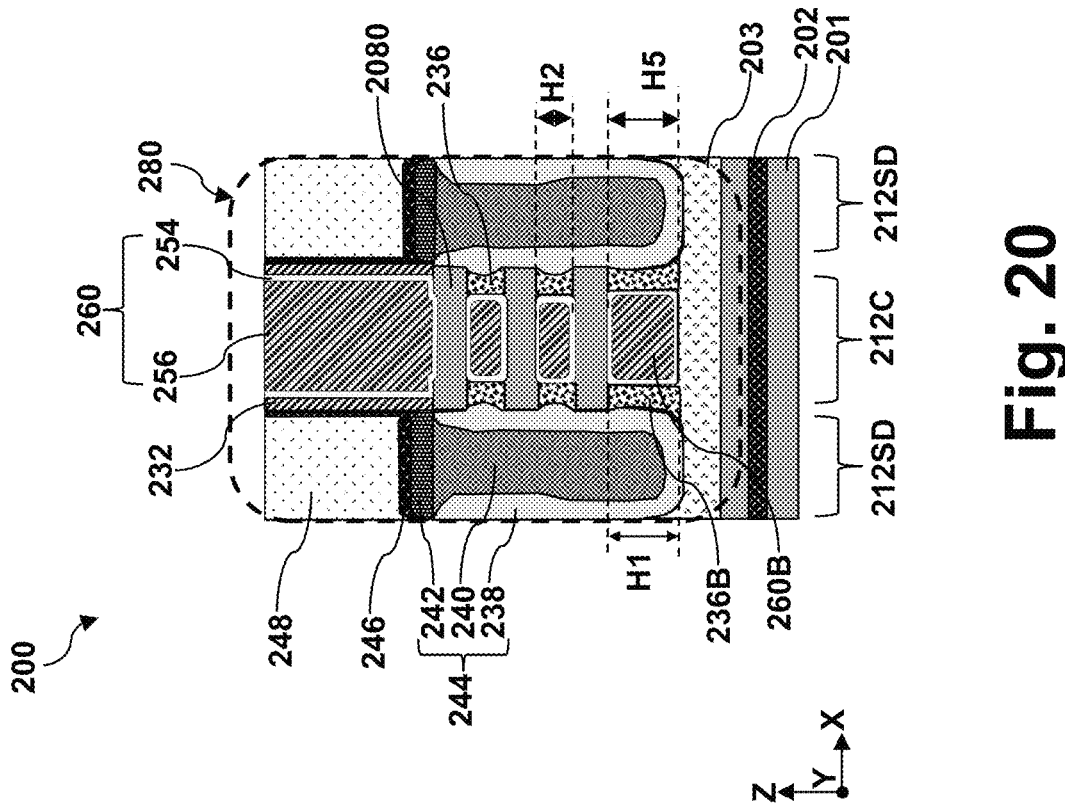
FIG. 20 illustrates a fragmentary cross-sectional view of another alternative semiconductor structure, according to one or more aspects of the present disclosure.

FIG. 20 illustrates another alternative embodiment of the semiconductor structure 200 where a bottom surfaces of the bottommost inner spacer feature 236B is substantially coplanar with a bottom surface of the gate structure 260. In other words, the bottom portion 260B of the gate structure 260 may be coterminous with the bottommost inner spacer feature 236B along the Z direction. To form the semiconductor structure 200 according to this alternative embodiment, operations at block 120 of the method 100 are performed such that the bottom space 252B does not overly extend downward into the buffer layer 203. In this alternative embodiment, because the bottom portion 260B does not extend to a level below the bottommost inner spacer feature 236B, drain-induced gate leakage or gate-drain capacitance may be alleviated or reduced. In the alternative embodiment illustrated in FIG. 20, the bottom portion 260B (and the bottom space 252B before the formation of the gate structure 260) has a fifth height H5, which is substantially the same as the first height H1 of the bottommost inner spacer feature 236B.

Figure 21:
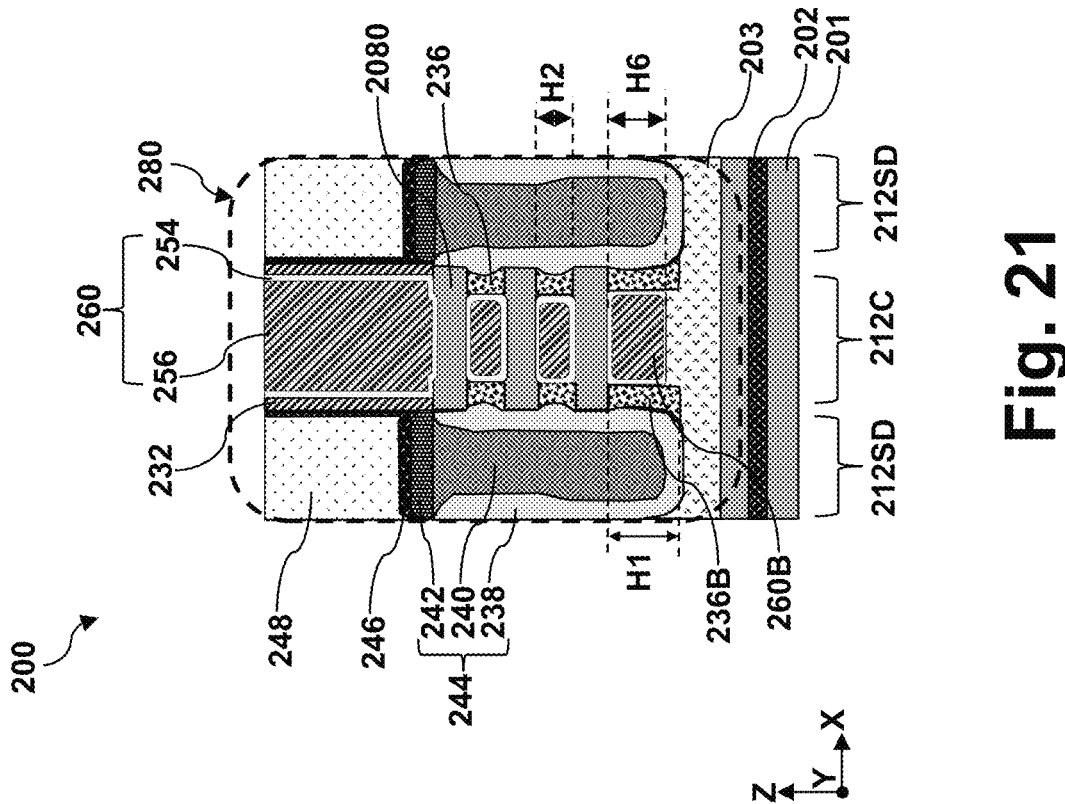
FIG. 21 illustrates a fragmentary cross-sectional view of yet another alternative semiconductor structure, according to one or more aspects of the present disclosure.

FIG. 21 illustrates yet another embodiment of the semiconductor structure 200 where the bottom surface of the bottom portion 260B of the gate structure 260 is higher than the bottom surface of the bottommost inner spacer feature 236B. In the alternative embodiment in FIG. 21, drain-induced gate leakage or gate-drain capacitance may be further reduced because the gate structure 260 is even better insulated from the source/drain features 244. In the embodiment shown in FIG. 21, the bottom portion 260B (and the bottom space 252B before the formation of the gate structure 260) has a sixth height H6, which is smaller than the first height H1 of the bottommost inner spacer feature 236B. In some instances, the sixth height H6 may be between about 6 nm and 70 nm.

In one exemplary aspect, the present disclosure is directed to a semiconductor structure. The semiconductor structure includes a plurality of nanostructures disposed over a substrate and a plurality of inner spacer features interleaving the plurality of nanostructures. The plurality of nanostructures are arranged along a direction perpendicular to the substrate. The plurality of inner spacer features include a bottommost inner spacer feature and upper inner spacer features disposed above the bottommost inner spacer feature. A first height of the bottommost inner spacer feature along the direction is greater than a second height of each of the upper inner spacer features.

In some embodiments, a ratio of the first height to the second height is between about 2 and about 3. In some instances, the first height is between about 10 nm and about 80 nm and the second height is between about 5 nm and about 30 nm. In some implementations, the semiconductor structure further includes a buffer layer disposed the substrate. A bottommost nanostructure of the plurality of nanostructures is spaced apart from the buffer layer by the bottommost inner spacer feature. In some instances, the semiconductor structure further includes a gate structure wrapping around each of the plurality of nanostructure. The gate structure includes a gate dielectric layer and a gate electrode layer. In some embodiments, the gate structure extends through the buffer layer along the direction to physically contact a top surface of the substrate. In some implementations, the semiconductor structure further includes a first source/drain feature and a second source/drain feature disposed on the buffer layer. The plurality of nanostructures extend between the first source/drain feature and the second source/drain feature. In some embodiments, a bottom surface of the gate structure is lower than bottom surfaces of the first source/drain feature and the second source/drain feature.

In another exemplary aspect, the present disclosure is directed to a semiconductor structure. The semiconductor structure includes a substrate, a buffer layer disposed on the substrate, a first source/drain feature and a second source/drain feature disposed over the buffer layer, a plurality of nanostructures extending between the first source/drain feature and the second source/drain feature along a first direction, a plurality of inner spacer features interleaving the plurality of nanostructures, and a gate structure wrapping around each of the plurality of nanostructures. The plurality of nanostructures are arranged along a second direction perpendicular to the substrate. A bottom surface of the gate structure is closer to the substrate than a bottom surface of the first source/drain.

In some embodiments, the plurality of inner spacer features include a bottommost inner spacer feature and upper inner spacer features disposed above the bottommost inner spacer feature and a first height of the bottommost inner spacer feature along the second direction is greater than a second height of each of the upper inner spacer features. In some implementations, a top surface of the substrate includes silicon and the buffer layer includes undoped germanium. In some embodiments, the substrate includes a buried oxide layer. In some instances, the gate structure extends through the buffer layer along the second direction to physically contact a top surface of the substrate. In some embodiments, the plurality of nanostructures include germanium-tin or silicon germanium. In some implementations, the first source/drain feature and the second source/drain feature include germanium-tin.

In yet another exemplary aspect, the present disclosure is directed to a method. The method includes depositing a buffer layer over a substrate, forming on the buffer layer a stack that includes a plurality of channel layers and a plurality of sacrificial layers interleaving the plurality of channel layers, forming a fin-shaped structure from the stack, the buffer layer and the substrate, the fin-shaped structure including a channel region and a source/drain region, forming a dummy gate stack over the channel region of the fin-shaped structure, depositing a gate spacer layer over the dummy gate stack, recessing the source/drain region to form a source/drain trench that exposes sidewalls of the plurality of channel layers and the plurality of sacrificial layers, selectively and partially recessing the plurality of sacrificial layers to form a plurality of inner spacer recesses, forming a plurality of inner spacer features in the plurality of inner spacer recesses, forming a source/drain feature in the source/drain trench, removing the dummy gate stack, selectively removing the plurality of sacrificial layers to release the plurality of channel layers in the channel region as a plurality of channel members, and forming a gate structure around each of the plurality of channel members. The recessing of the source/drain region recesses the buffer layer such that the source/drain trench extends into the buffer layer. The selectively and partially recessing includes recessing the buffer layer such that a bottommost inner spacer recess of the plurality of inner spacer recesses has a height greater than the rest of the plurality of inner spacer recesses.

In some embodiments, the selectively removing of the plurality of sacrificial layers also etches the buffer layer in the channel region. In some implementations, the selectively removing of the plurality of sacrificial layers completely removes the buffer layer in the channel region to expose a top surface of the substrate. In some instances, after the forming of the gate structure, a bottom surface of the gate structure is lower than a bottom surface of the source/drain feature. In some embodiments, the plurality of channel layers include silicon germanium or germanium-tin and the plurality of sacrificial layers include doped germanium.

The foregoing outlines features of several embodiments so that those of ordinary skill in the art may better understand the aspects of the present disclosure. Those of ordinary skill in the art should appreciate that they may readily use the present disclosure as a basis for designing or modifying other processes and structures for carrying out the same purposes and/or achieving the same advantages of the embodiments introduced herein. Those of ordinary skill in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor structure, comprising:
   a plurality of nanostructures disposed over a substrate, wherein the plurality of nanostructures are arranged along a first direction, wherein the first direction is perpendicular to the substrate;
   a plurality of inner spacer features interleaving the plurality of nanostructures; and
   a first source/drain feature and a second source/drain feature disposed over the substrate,
   wherein each of the first source/drain feature and the second source/drain feature comprises:
      a first epitaxial layer interfacing end surfaces of the plurality of nanostructures, a second epitaxial layer spaced apart from the end surfaces of the plurality of nanostructures by the first epitaxial layer, and a third epitaxial layer disposed on and in contact with the first epitaxial layer and the second epitaxial layer, wherein the first epitaxial layer and the second epitaxial layer comprise germanium-tin while the third epitaxial layer comprises silicon-germanium-tin, wherein a germanium content in the third epitaxial layer is smaller than a germanium content in the second epitaxial layer, wherein the plurality of inner spacer features comprise a bottommost inner spacer feature and upper inner spacer features disposed above the bottommost inner spacer feature, wherein a first height of the bottommost inner spacer feature along the first direction is greater than a second height of each of the upper inner spacer features.

2. The semiconductor structure of claim 1, wherein a ratio of the first height to the second height is between about 2 and about 3.

3. The semiconductor structure of claim 1, wherein the first height is between about 10 nm and about 80 nm, and wherein the second height is between about 5 nm and about 30 nm.

4. The semiconductor structure of claim 1, further comprising:

a buffer layer disposed on the substrate, wherein a bottommost nanostructure of the plurality of nanostructures is spaced apart from the buffer layer by the bottommost inner spacer feature, wherein the first source/drain feature and the second source/drain feature partially extend into the buffer layer.

5. The semiconductor structure of claim 4, further comprising:

a gate structure wrapping around each of the plurality of nanostructures, wherein the gate structure comprises a gate dielectric layer and a gate electrode layer.

6. The semiconductor structure of claim 5, wherein the gate structure extends through the buffer layer along the first direction to physically contact a top surface of the substrate.

7. The semiconductor structure of claim 5, wherein the first source/drain feature and the second source/drain feature are disposed on the buffer layer, wherein the plurality of nanostructures extend between the first source/drain feature and the second source/drain feature.

8. The semiconductor structure of claim 7, wherein a bottom surface of the gate structure is lower than bottom surfaces of the first source/drain feature and the second source/drain feature.

9. A semiconductor structure, comprising:

a substrate;

a buffer layer disposed on the substrate;

a first source/drain feature and a second source/drain feature disposed over the buffer layer;

a plurality of nanostructures extending between the first source/drain feature and the second source/drain feature along a first direction, wherein the plurality of nanostructures are arranged along a second direction perpendicular to the substrate;

a plurality of inner spacer features interleaving the plurality of nanostructures; and a gate structure wrapping around each of the plurality of nanostructures, wherein the plurality of inner spacer features comprise a bottommost inner spacer feature interfacing a top surface of the buffer layer and upper inner spacer features disposed above the bottommost inner spacer feature, wherein a bottommost nanostructure of the plurality of nanostructures is vertically spaced apart from the top surface of the buffer layer by the bottommost inner spacer feature, wherein a bottom portion of the gate structure extends continuously through the buffer layer between a bottom surface of the bottommost nanostructure and a top surface of the substrate.

10. The semiconductor structure of claim 9, wherein a first height of the bottommost inner spacer feature along the second direction is greater than a second height of each of the upper inner spacer features.

11. The semiconductor structure of claim 9, wherein the top surface of the substrate comprises silicon, wherein the buffer layer comprises undoped germanium.

12. The semiconductor structure of claim 9, wherein the substrate comprises a buried oxide layer.

13. The semiconductor structure of claim 9, wherein the bottom portion of the gate structure comprises a height along the second direction, wherein the height is between about 55 nm and about 240 nm.

14. The semiconductor structure of claim 9, wherein the plurality of nanostructures comprise germanium-tin or silicon germanium.

15. The semiconductor structure of claim 9, wherein the first source/drain feature and the second source/drain feature comprise germanium-tin.

16. A semiconductor structure, comprising:

a silicon-on-insulator (SOI) substrate;

a buffer layer disposed on the SOI substrate;

a first source/drain feature and a second source/drain feature disposed over the buffer layer;

a plurality of nanostructures extending between the first source/drain feature and the second source/drain feature along a first direction, wherein the plurality of nanostructures are arranged along a second direction perpendicular to the SOI substrate;

a plurality of inner spacer features interleaving the plurality of nanostructures; and a gate structure wrapping around each of the plurality of nanostructures, wherein the gate structure extends continuously from along a sidewall of a bottommost one of the plurality of inner spacer features to along a sidewall of the buffer layer, wherein a bottom surface of the gate structure is closer to the SOI substrate than a bottom surface of the first source/drain feature.

17. The semiconductor structure of claim 16, wherein the plurality of inner spacer features comprise a bottommost inner spacer feature and upper inner spacer features disposed above the bottommost inner spacer feature, wherein a first height of the bottommost inner spacer feature along the second direction is greater than a second height of each of the upper inner spacer features.

18. The semiconductor structure of claim 17, wherein a ratio of the first height to the second height is between about 2 and about 3.

19. The semiconductor structure of claim 16, wherein the buffer layer comprises undoped germanium.

20. The semiconductor structure of claim 16, wherein the gate structure extends through the buffer layer along the second direction to physically contact a top surface of the SOI substrate.

\* \* \* \* \*